(12) United States Patent
Xue et al.

(10) Patent No.: US 12,237,343 B2
(45) Date of Patent: Feb. 25, 2025

(54) DISPLAY PANEL AND DISPLAY DEVICE

(71) Applicants: HEFEI BOE OPTOELECTRONICS TECHNOLOGY CO., LTD., Anhui (CN); BOE Technology Group Co., Ltd., Beijing (CN)

(72) Inventors: Wei Xue, Beijing (CN); Fengjing Tang, Beijing (CN); Hongmin Li, Beijing (CN)

(73) Assignees: HEFEI BOE OPTOELECTRONICS TECHNOLOGY CO., LTD., Anhui (CN); BOE Technology Group Co., Ltd., Beijing (CN)

( * ) Notice: Subject to any disclaimer, the term of this patent is extended or adjusted under 35 U.S.C. 154(b) by 608 days.

(21) Appl. No.: 17/606,736

(22) PCT Filed: Dec. 24, 2020

(86) PCT No.: PCT/CN2020/139038
§ 371 (c)(1),
(2) Date: Oct. 26, 2021

(87) PCT Pub. No.: WO2022/133909
PCT Pub. Date: Jun. 30, 2022

(65) Prior Publication Data
US 2022/0399378 A1    Dec. 15, 2022

(51) Int. Cl.
*H01L 27/12*     (2006.01)
*G09G 3/20*     (2006.01)

(52) U.S. Cl.
CPC ....... *H01L 27/1244* (2013.01); *G09G 3/2096* (2013.01); *G09G 2310/0286* (2013.01); *G09G 2310/08* (2013.01); *G09G 2320/0223* (2013.01)

(58) Field of Classification Search
CPC .............. H01L 27/1244; G09G 3/2096; G09G 2310/0286; G09G 2310/08; G09G 2320/0223
See application file for complete search history.

(56) References Cited

U.S. PATENT DOCUMENTS

| | | | |
|---|---|---|---|
| 9,627,415 B2 * | 4/2017 | Koo | ............ H01L 27/124 |
| 11,177,273 B2 * | 11/2021 | Kim | ............ H10B 43/40 |

(Continued)

FOREIGN PATENT DOCUMENTS

| | | |
|---|---|---|
| CN | 1632650 A | 6/2005 |
| CN | 207781607 U | 8/2018 |

(Continued)

*Primary Examiner* — Benjamin Tzu-Hung Liu
(74) *Attorney, Agent, or Firm* — IPro, PLLC

(57) ABSTRACT

A display panel includes a driving circuit and a signal line. The signal line includes at least two main signal sub-lines each including a first end and a second end, the first ends of the at least two main signal sub-lines are electrically coupled to each other, and the second ends thereof are electrically coupled to each other. N main signal sub-lines in the at least two main signal sub-lines are directly electrically coupled to the driving circuit. Each of the N main signal sub-lines is a direct-coupled main signal sub-line, and a main signal sub-line in the at least two main signal sub-lines other than the direct-coupled main signal sub-lines is an indirect-coupled main signal sub-line which is not directly electrically coupled to the driving circuit but electrically coupled to the driving circuit via the direct-coupled main signal sub-line, where N is a positive integer.

16 Claims, 17 Drawing Sheets

(56) References Cited

U.S. PATENT DOCUMENTS 11,532,644 B2 * 12/2022 Huang .............. H01L 23/49838
2019/0206894 A1 7/2019 Lee et al.

FOREIGN PATENT DOCUMENTS

| CN | 207895834 U | 9/2018 |
| CN | 109491165 A | 3/2019 |
| JP | H03214671 A | 9/1991 |
| TW | 293178 B | 12/1996 |
| TW | I293178 B | 2/2008 |
| TW | 201135329 A | 10/2011 |

* cited by examiner

DISPLAY PANEL AND DISPLAY DEVICE

CROSS-REFERENCE TO RELATED APPLICATION

The present application is the U.S. national phase of PCT Application No. PCT/CN2020/139038 filed on Dec. 24, 2020, which is incorporated herein by reference in its entirety.

TECHNICAL FIELD

The present disclosure relates to the field of display technology, in particular to a display panel and a display device.

BACKGROUND

In a related display device, a shift register unit of a driving circuit includes an output transistor, a source electrode of which is electrically coupled to a clock signal line, and a drain electrode of which is electrically coupled to a signal output end of the shift register unit. During the operation of the shift register unit, transmission signal distortion occurs due to a large resistance of the clock signal line and a large parasitic capacitance of the clock signal line, and thereby a signal provided by the shift register unit via the signal output end has a long falling-down time.

SUMMARY

In one aspect, the present disclosure provides in some embodiments a display panel, including a driving circuit arranged on a base substrate and a signal line configured to provide a signal to the driving circuit. The signal line includes at least two main signal sub-lines, each main signal sub-line includes a first end and a second end, the first ends of the at least two main signal sub-lines are electrically coupled to each other, and the second ends of the at least two main signal sub-lines are electrically coupled to each other. N main signal sub-lines in the at least two main signal sub-lines are directly electrically coupled to the driving circuit, and configured to provide the signal to the driving circuit. Each of the N main signal sub-lines is a direct-coupled main signal sub-line, and a main signal sub-line in the at least two main signal sub-lines other than the direct-coupled main signal sub-lines is an indirect-coupled main signal sub-line, and the indirect-coupled main signal sub-line is not directly electrically coupled to the driving circuit but electrically coupled to the driving circuit via the direct-coupled main signal sub-line, where N is a positive integer and smaller than the quantity of the main signal sub-lines in the signal line.

In a possible embodiment of the present disclosure, the at least two main signal sub-lines are formed at a same conductive layer, or at different conductive layers.

In a possible embodiment of the present disclosure, the display panel further includes connection lines, each connection line is electrically coupled to the driving circuit, the connection lines and the direct-coupled main signal sub-lines are arranged at different conductive layers, the connection line is electrically coupled to the direct-coupled main signal sub-line through a via-hole, and the connection lines at a same layer do not overlap each other.

In a possible embodiment of the present disclosure, the quantity of main signal sub-lines in the signal line is A, the signal line further includes M auxiliary signal sub-lines, and an $a^{th}$ main signal sub-line corresponds to an $m^{th}$ auxiliary signal sub-line, where A is an integer greater than 1, M is a positive integer, a is a positive integer smaller than or equal to A, and m is a positive integer smaller than or equal to M. The $a^{th}$ main signal sub-line is electrically coupled to the $m^{th}$ auxiliary signal sub-line through at least two connection via-holes, the $a^{th}$ main signal sub-line and the $m^{th}$ auxiliary signal sub-line are arranged at different conductive layers, and an orthogonal projection of the $a^{th}$ main signal sub-line onto the base substrate at least partially overlaps an orthogonal projection of the $m^{th}$ auxiliary signal sub-line onto the base substrate.

In a possible embodiment of the present disclosure, a maximum distance between an orthogonal projection of one connection via-hole in the at least two connection via-holes onto the base substrate and an orthogonal projection of a first end of the $a^{th}$ main signal sub-line onto the base substrate is smaller than a first predetermined distance, and a maximum distance between an orthogonal projection of another connection via-hole in the at least two connection via-holes onto the base substrate and an orthogonal projection of a second end of the $a^{th}$ main signal sub-line onto the base substrate is smaller than the first predetermined distance.

In a possible embodiment of the present disclosure, each auxiliary signal sub-line includes a plurality of auxiliary line portions electrically coupled to a corresponding main signal sub-line through at least two via-holes, and an orthogonal projection of each auxiliary line portion onto the base substrate is located within an orthogonal projection of the corresponding main signal sub-line onto the base substrate.

In a possible embodiment of the present disclosure, the auxiliary line portion includes a third end and a fourth end, a maximum distance between an orthogonal projection of one via-hole in the at least two via-holes onto the base substrate and an orthogonal projection of the third end of the auxiliary line portion onto the base substrate is smaller than a second predetermined distance, and a maximum distance between an orthogonal projection of another via-hole in the at least two via-holes onto the base substrate and an orthogonal projection of the fourth end of the auxiliary line portion onto the base substrate is smaller than the second predetermined distance.

In a possible embodiment of the present disclosure, a gap is provided between two adjacent auxiliary line portions of a same auxiliary signal sub-line. The display panel further includes connection lines each electrically coupled to the direct-coupled main signal sub-line through a via-hole, and different connection lines at a same layer do not overlap each other. The connection lines and the auxiliary signal sub-lines are arranged at a same conductive layer, the connection lines are electrically coupled to the driving circuit through a part of the gap, and the connection lines and the auxiliary signal sub-lines do not overlap to each other.

In a possible embodiment of the present disclosure, the signal line includes a first clock signal line and a second clock signal, the display panel includes a driving circuit, and the driving circuit, the first clock signal line and the second clock signal line are arranged at a same side of the display panel. The first clock signal line includes a first main signal sub-line and a second main signal sub-line, and the second clock signal line includes a third main signal sub-line and a fourth main signal sub-line. The driving circuit includes a plurality of levels of shift register units, the first main signal sub-line is directly electrically coupled to odd-numbered-level shift register units, and the third main signal sub-line is directly electrically coupled to even-numbered-level shift register units.

In a possible embodiment of the present disclosure, the signal line includes a first clock signal line, a second clock signal line, a third clock signal line and a fourth clock signal line, the display panel includes a first driving circuit and a second driving circuit, the first driving circuit, the first clock signal line and the second clock signal line are arranged at one side of the display panel, and the second driving circuit, the third clock signal line and the fourth clock signal line are arranged at the other side of the display panel. The first clock signal line includes a first main signal sub-line and a second main signal sub-line, the second clock signal line includes a third main signal sub-line and a fourth main signal sub-line, the third clock signal line includes a fifth main signal sub-line and a sixth main signal sub-line, and the fourth clock signal line includes a seventh main signal sub-line and an eighth main signal sub-line. The first driving circuit includes a plurality of levels of shift register units, and the second driving circuit includes a plurality of levels of shift register units. The first main signal sub-line is directly electrically coupled to odd-numbered-level shift register units in the first driving circuit, the third main signal sub-line is directly electrically coupled to even-numbered-level shift register units in the first driving circuit, the fifth main signal sub-line is directly electrically coupled to odd-numbered-level shift register units in the second driving circuit, and the seventh main signal sub-line is directly electrically coupled to even-numbered-level shift register units in the second driving circuit.

In another aspect, the present disclosure provides in some embodiments a display device including the above-mentioned display panel.

In a possible embodiment of the present disclosure, the display device further includes a driving chip configured to provide the signal via a signal output end, and the signal output end of the driving chip is electrically coupled to the first ends of the at least two main signal sub-lines.

DETAILED DESCRIPTION

Figure 1:
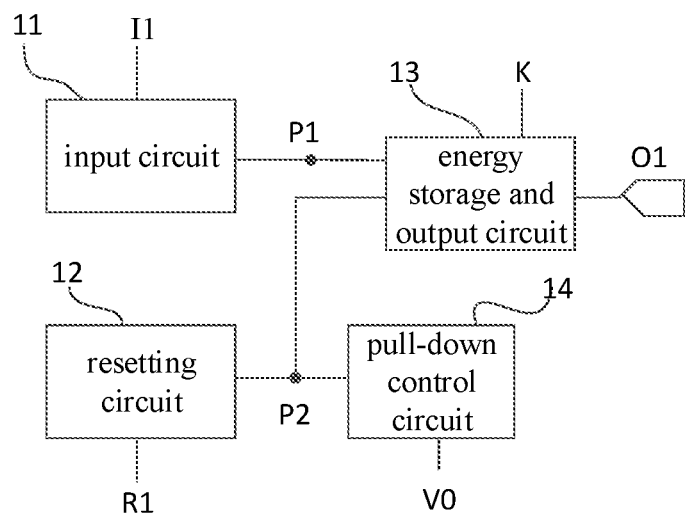
FIG. 1 is a schematic view showing a gate driving circuit according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a display panel, which includes a driving circuit arranged on a base substrate and a signal line configured to provide a signal to the driving circuit. The signal line includes at least two main signal sub-lines, each main signal sub-line includes a first end and a second end, the first ends of the at least two main signal sub-lines are electrically coupled to each other, and the second ends of the at least two main signal sub-lines are electrically coupled to each other. N main signal sub-lines in the at least two main signal sub-lines are directly electrically coupled to the driving circuit, and configured to provide the signal to the driving circuit. Each of the N main signal sub-lines is a direct-coupled main signal sub-line, and a main signal sub-line in the at least two main signal sub-lines other than the direct-coupled main signal sub-lines is an indirect-coupled main signal sub-line, and the indirect-coupled main signal sub-line is not directly electrically coupled to the driving circuit but electrically coupled to the driving circuit via the direct-coupled main signal sub-line, where N is a positive integer and smaller than the quantity of the main signal sub-lines in the signal line.

According to the embodiments of the present disclosure, the signal line includes the at least two main signal sub-lines coupled in parallel to each other, so as to reduce a resistance of the signal line. In addition, the N main signal sub-lines are directly electrically coupled to the driving circuit, and configured to provide the signal to the driving circuit, where N is smaller than the quantity of the main signal sub-lines in the signal line. Each of the N main signal sub-lines is the direct-coupled main signal sub-line, and the indirect-coupled main signal sub-line is not directly electrically coupled to the driving circuit but electrically coupled to the driving circuit via the direct-coupled main signal sub-line. Hence, the main signal sub-line not directly electrically coupled to the driving circuit has a capacitance capable of being omitted substantially and has a very small RC delay. As a result, no distortion occurs for a waveform of a signal on the main signal sub-line not directly electrically coupled to the driving circuit.

In a possible embodiment of the present disclosure, the signal line is an alternating current signal line, e.g., the signal line is, but not limited to, a clock signal line.

In the embodiments of the present disclosure, the driving circuit is a circuit for providing a control signal to a pixel circuit, and the control signal is, but not limited to, a gate driving signal, a light-emission control signal or a resetting control signal.

During the implementation, the driving circuit is arranged at, but not limited to, a side of the display panel.

When the signal line is a clock signal line, the clock signal line is adopted by the display panel and the driving circuit is a gate driving circuit, a rise time and a fall time of each of a clock signal on the clock signal line and a gate driving signal outputted by the gate driving circuit are reduced remarkably. For example, at a distal end of the clock signal line, the rise time of the clock signal decreases from 2.87 μs to 1.49 μs, the fall time of the clock signal decreases from 3.13 μs to 1.63 μs, the rise time of the gate driving signal decreases from 5.97 μs to 3.94 μs, and the fall time of the gate driving signal decreases from 5.37 μs to 3.64 μs. At a proximal end of the clock signal line, the rise time of the clock signal decreases from 1.2 μs to 0.58 μs, the fall time of the clock signal decreases from 1.3 μs to 0.63 μs, the rise time of the gate driving signal decreases from 1.81 μs to 1.77 μs, and the fall time of the gate driving signal decreases from 1.70 μs to 1.67 μs.

As shown in FIG. 1, the gate driving circuit in the embodiments of the present disclosure includes an input circuit 11, a resetting circuit 12, an energy storage and output circuit 13 and a pull-down control circuit 14. The input circuit 11 is electrically coupled to an input end I1 and a pull-up node P1, and configured to control a potential at the pull-up node P1 in accordance with an input signal from the input end I1. The resetting circuit 12 is electrically coupled to a resetting end R1, the pull-up node P1 and a low voltage end V0, and configured to reset the gate driving circuit in accordance with a resetting signal from the resetting end R1. The energy storage and output circuit 13 is electrically coupled to the pull-up node P1, a pull-down node P2, a clock signal line K and a gate driving signal output end O1, and configured to control O1 to output a gate driving signal in accordance with a clock signal from the clock signal line K under the control of the potential at P1 and a potential at P2. The pull-down control circuit 14 is electrically coupled to the pull-up node P1, the pull-down node P2 and the low voltage end V0, and configured to control the potential at P2 under the control of the potential at P1.

Figure 2:
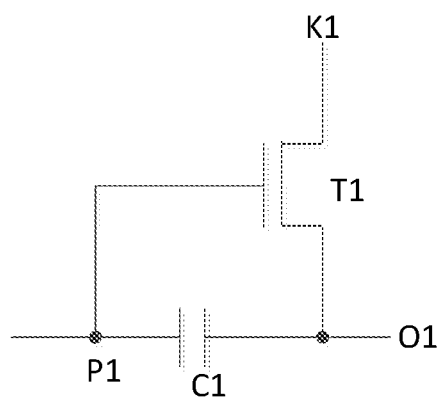
FIG. 2 is a circuit diagram of an energy storage and output circuit in the gate driving circuit according to one embodiment of the present disclosure.

As shown in FIG. 2, the energy storage and output circuit in the embodiments of the present disclosure includes a capacitor C1 and an output transistor T1. A gate electrode of T1 is electrically coupled to the pull-up node P1, a source electrode of T1 is electrically coupled to the clock signal line K, and a drain electrode of T1 is electrically coupled to the gate driving signal output end O1. A first end of C1 is electrically coupled to the pull-up node P1, and a second end of C1 is electrically coupled to the gate driving signal output end O1.

In FIG. 2, T1 is, but not limited to, an n-type Thin Film Transistor (TFT).

During the operation of the energy storage and output circuit in FIG. 2, C1 is charged after the input circuit has finished its work, so as to pull up the potential at P1 and turn on T1. At this time, a potential of the clock signal from K is a low voltage, so O1 does not output any signal. At a next time point, when the potential of the clock signal from K is a high voltage, O1 outputs a high voltage because T1 is turned on, and the potential at P1 is pulled up continuously due to a bootstrapping effect of C1.

In the embodiments of the present disclosure, the signal line is a clock signal line. An RC delay of the signal line is reduced, and the distortion of the signal transmitted on the signal line is improved, so no distortion occurs for the clock signal at the distal end of the clock signal line. As a result, it is able to remarkably reduce the fall time Tf of the signal outputted by the shift register unit electrically coupled to a portion of the clock signal line adjacent to the distal end, thereby to increase a charging time.

When the driving circuit is a gate driving circuit and the signal outputted by the driving circuit is a gate driving signal having a relatively large fall time, a next-level shift register unit in the gate driving circuit outputs an active gate driving signal to charge pixel circuits in a corresponding row, and meanwhile a previous-level shift register unit in the gate driving circuit also probably outputs an active gate driving signal. At this time, an image is displayed by a display device erroneously. Hence, it is necessary to solve the problem that the fall time Tf of the signal outputted by the shift register unit is large.

In the related art, for a display product with a medium or small size, a width-to-length ratio of T1 is increased so as to reduce the fall time Tf of the signal outputted by the driving circuit. However, the size of the display product becomes larger and larger, and a resolution and a refreshing rate of the display product increase gradually. At this time, on one hand, it is necessary to provide T1 with a very large width-to-length ratio, e.g., more than 10000/3.5. On the other hand, due to the large width-to-length ration, the clock signal line has a large load. The load of the clock signal line includes two parts, i.e., resistance and capacitance. The larger the size of the display product is, the longer the line is, and the larger the resistance in the case of a same line width is. Apart from an overlapping capacitance between the signal lines, a majority of the capacitance of the clock signal line includes a parasitic capacitance Cgs of T1. The larger the width-to-length ratio of T1 is, the larger the Cgs is, and the larger the capacitance of the clock signal line is. In the related art, the RC delay of the clock signal line leads to the distortion of the waveform of the clock signal on the clock signal line. The clock signal is outputted by the driving circuit, so the fall time Tf of the signal outputted by the driving circuit increases due to the distortion of the waveform of the clock signal. It is still impossible to reduce Tf obviously even when the width-to-length ratio of T1 is increased unlimitedly. According to the display panel in the embodiments of the present disclosure, it is able to reduce the RC delay of the signal line and improve the distortion of the signal on the signal line, so no distortion occurs for the clock signal outputted by the clock signal line at the distal end. As a result, it is able to remarkably reduce the fall time Tf of the signal outputted by the shift register unit electrically coupled to a portion of the clock signal line adjacent to the distal end, thereby to increase the charging time.

In a possible embodiment of the present disclosure, an angle between extension directions of two main signal sub-lines is smaller than a predetermined angle.

During the implementation, the angle between the extension directions of the two main signal sub-lines is smaller than the predetermined angle, so that the two main signal sub-lines are approximately parallel to each other. However, the present disclosure is not limited thereto.

In the embodiments of the present disclosure, the predetermined angle is selected according to the practical need. For example, the predetermined angle it, but not limited to, 2°.

In actual use, when the two main signal sub-lines are arranged at a same conductive layer, the two main signal sub-lines do not intersect each other.

In the embodiments of the present disclosure, the conductive layer is, but not limited to, a gate metal layer or a source-drain metal layer.

During the implementation, a maximum distance between the first ends of any two main signal sub-lines is smaller than a first predetermined distance, and a maximum distance between the second ends of any two main signal sub-lines is smaller than a second predetermined distance.

In the embodiments of the present disclosure, the first predetermined distance and the second predetermined distance are selected according to the practical need, so that the first ends of any two main signal sub-lines are arranged close to each other, and the second ends of any two main signal sub-lines are arranged close to each other.

In a possible embodiment of the present disclosure, the first ends of two main signal sub-lines are electrically coupled to each other via a first connection conductive line, and the second ends of two main signal sub-lines are electrically coupled to each other via a second connection conductive line. In the embodiments of the present disclosure, when the maximum distance between the first ends of any two main signal sub-lines is smaller than the first predetermined distance and the maximum distance between the second ends of any two main signal sub-lines is smaller than the second predetermined distance, the first connection conductive line is relatively short and the second connection conductive line is relatively sort, so it is able to facilitate the wiring, and prevent the formation of via-holes when each of the long first connection conductive line and the long second connection conductive line overlaps the other signal line at a same layer.

In a possible embodiment of the present disclosure, the at least two main signal sub-lines are formed at a same conductive layer, or at different conductive layers.

During the implementation, the at least two main signal sub-lines are formed at a same conductive layer, e.g., the gate metal layer. Alternatively, the at least two main signal sub-lines are formed at different conductive layers, e.g., a part of the main signal sub-lines are formed at a first gate metal layer, and the other part of the main signal sub-lines are formed at a second gate metal layer. However, the present disclosure is not limited thereto.

In a possible embodiment of the present disclosure, the display panel further includes connection lines, each connection line is electrically coupled to the driving circuit, the connection lines and the direct-coupled main signal sub-lines are arranged at different conductive layers, each connection line is electrically coupled to a corresponding direct-coupled main signal sub-line through a via-hole, and the connection lines at a same layer do not overlap each other.

The connection line is arranged at a first conductive layer, the main signal sub-line is arranged at a second conductive layer, an insulation layer is arranged between the first conductive layer and the second conductive layer, and the connection line is electrically coupled to the corresponding direct-coupled main signal sub-line through a via-hole penetrating through the insulation layer. During the implementation, other members and lines are arranged at the second conductive layer and between the direct-coupled main signal sub-line and the driving circuit. In order to prevent the occurrence of a short circuit, the direct-coupled main signal sub-line needs to be electrically coupled to the driving circuit through the connection line at the first conductive layer.

In the embodiments of the present disclosure, the quantity of main signal sub-lines in the signal line is A, the signal line further includes M auxiliary signal sub-lines, and an $a^{th}$ main signal sub-line corresponds to an $m^{th}$ auxiliary signal sub-line, where A is an integer greater than 1, M is a positive integer, a is a positive integer smaller than or equal to A, and m is a positive integer smaller than or equal to M. The $a^{th}$ main signal sub-line is electrically coupled to the $m^{th}$ auxiliary signal sub-line, the $a^{th}$ main signal sub-line and the $m^{th}$ auxiliary signal sub-line are arranged at different conductive layers, and an orthogonal projection of the $a^{th}$ main signal sub-line onto the base substrate at least partially overlaps an orthogonal projection of the $m^{th}$ auxiliary signal sub-line onto the base substrate.

During the implementation, apart from A main signal sub-lines, the signal line further includes M auxiliary signal sub-lines, where M is smaller than or equal to A. The $a^{th}$ main signal sub-line corresponds to the $m^{th}$ auxiliary signal sub-line. The $a^{th}$ main signal sub-line is electrically coupled to the $m^{th}$ auxiliary signal sub-line through at least two connection via-holes, and the $a^{th}$ main signal sub-line and the $m^{th}$ auxiliary signal sub-line are arranged at different conductive layers. The orthogonal projection of the $a^{th}$ main signal sub-line onto the base substrate at least partially overlaps the orthogonal projection of the $m^{th}$ auxiliary signal sub-line onto the base substrate, so as to increase a thickness of the signal line, thereby to further reduce the resistance of the signal line.

In a possible embodiment of the present disclosure, a maximum distance between an orthogonal projection of one connection via-hole in the at least two connection via-holes onto the base substrate and an orthogonal projection of a first end of the $a^{th}$ main signal sub-line onto the base substrate is smaller than a first predetermined distance, and a maximum distance between an orthogonal projection of another connection via-hole in the at least two connection via-holes onto the base substrate and an orthogonal projection of a second end of the $a^{th}$ main signal sub-line onto the base substrate is smaller than the first predetermined distance. In this way, it is able for the $a^{th}$ main signal sub-line to be coupled in parallel to the $m^{th}$ auxiliary signal sub-line, thereby to further reduce the resistance of the signal line.

In the embodiments of the present disclosure, the first predetermined distance is selected according to the practical need, so that one of the at least two connection via-holes is arranged close to the first end of the $a^{th}$ main signal sub-line, and the other one of the at least two connection via-holes is arranged close to the second end of the $a^{th}$ main signal sub-line.

In the embodiments of the present disclosure, the orthogonal projection of the $m^{th}$ auxiliary signal sub-line onto the base substrate is located, but not limited to, within the orthogonal projection of the $a^{th}$ main signal sub-line onto the base substrate.

In a possible embodiment of the present disclosure, the auxiliary signal sub-line includes a plurality of auxiliary line portions electrically coupled to a corresponding main signal sub-line through at least two via-holes, and an orthogonal projection of each auxiliary line portion onto the base substrate is located within an orthogonal projection of the corresponding main signal sub-line onto the base substrate, so as to reduce the resistance of the signal line in a better manner.

During the implementation, the auxiliary line portion includes a third end and a fourth end, a maximum distance between an orthogonal projection of one via-hole in the at least two via-holes onto the base substrate and an orthogonal projection of the third end of the auxiliary line portion onto the base substrate is smaller than a second predetermined distance, and a maximum distance between an orthogonal projection of another via-hole in the at least two via-holes onto the base substrate and an orthogonal projection of the fourth end of the auxiliary line portion onto the base substrate is smaller than the second predetermined distance. In this way, it is able for the $a^{th}$ main signal sub-line to be coupled in parallel to the $m^{th}$ auxiliary signal sub-line, thereby to further reduce the resistance of the signal line.

In the embodiments of the present disclosure, the third predetermined distance is selected according to the practical need, so that one of the at least two connection via-holes is arranged close to the third end of the auxiliary line portion, and the other one of the at least two connection via-holes is arranged close to the fourth end of the auxiliary line portion.

During the implementation, an extension direction of each auxiliary line portion is identical to, or substantially identical to, an extension direction of the corresponding main signal sub-line.

For example, when the auxiliary line portion and the corresponding main signal sub-line each extend in a vertical direction, the first end and the third end are lower ends, and the second end and the fourth end are upper ends. However, the present disclosure is not limited thereto.

When the extension direction of the auxiliary line portion is substantially identical to the extension direction of the corresponding main signal sub-line, it means that an angle between the extension direction of the auxiliary line portion and the extension direction of the corresponding main signal sub-line is smaller than a predetermined angle.

In the embodiments of the present disclosure, a gap is provided between two adjacent auxiliary line portions of a same auxiliary signal sub-line. The display panel further includes connection lines each electrically coupled to the direct-coupled main signal sub-line through a via-hole, and different connection lines at a same layer do not intersect each other. The connection lines and the auxiliary signal sub-lines are arranged at a same conductive layer, and the connection lines penetrate a part of the gap and are electrically coupled to the driving circuit through.

During the implementation, each connection line does not overlap any auxiliary signal sub-line to prevent the occurrence of mangled signal output, so the gap is provided between two adjacent auxiliary line portions of a same auxiliary signal sub-line, so as to enable the connection line to penetrate a part of gap and be electrically coupled to the driving circuit.

In a possible embodiment of the present disclosure, the display panel includes a driving circuit, the driving circuit and the signal line are arranged at a first side or a second side of the base substrate, and the first side is opposite to the second side.

During the implementation, the signal is arranged at a side of the driving circuit away from a display region, or between the driving circuit and the display region.

During the implementation, the signal line includes a first clock signal line and a second clock signal line, the display panel includes a driving circuit, and the driving circuit, the first clock signal line and the second clock signal line are arranged at a same side of the display panel. The first clock signal line includes a first main signal sub-line and a second main signal sub-line, and the second clock signal line includes a third main signal sub-line and a fourth main signal sub-line. The driving circuit includes a plurality of levels of shift register units. A first end of the first main signal sub-line is electrically coupled to a first end of the second main signal sub-line through a conductive line, and a second end of the first main signal sub-line is electrically coupled to a second end of the second main signal sub-line through a conductive line. When the first main signal sub-line is coupled in parallel to the second main signal sub-line, it is able to reduce a resistance of the first clock signal line. A first end of the third main signal sub-line is electrically coupled to a first end of the fourth main signal sub-line through a conductive line, and a second end of the third main signal sub-line is electrically coupled to a second end of the fourth main signal sub-line through a conductive line. When the third main signal sub-line is coupled in parallel to the fourth main signal sub-line, it is able to reduce a resistance of the second clock signal line. The first main signal sub-line is directly electrically coupled to odd-numbered-level shift register units, and the third main signal sub-line is directly electrically coupled to even-numbered-level shift register units. The second main signal sub-line is not directly electrically coupled to the shift register unit, and the fourth main signal sub-line is not directly electrically coupled to the shift register unit, so as to provide each of the second main signal sub-line and the fourth main signal sub-line with a very small parasitic capacitance. In this way, it is able to prevent the clock signal outputted by the clock signal line from being distorted at the distal end, thereby to remarkably reduce the fall time Tf of the signal outputted by the shift register unit electrically coupled to a portion of the clock signal line at the distal end, and increase the charging time.

Figure 3A:
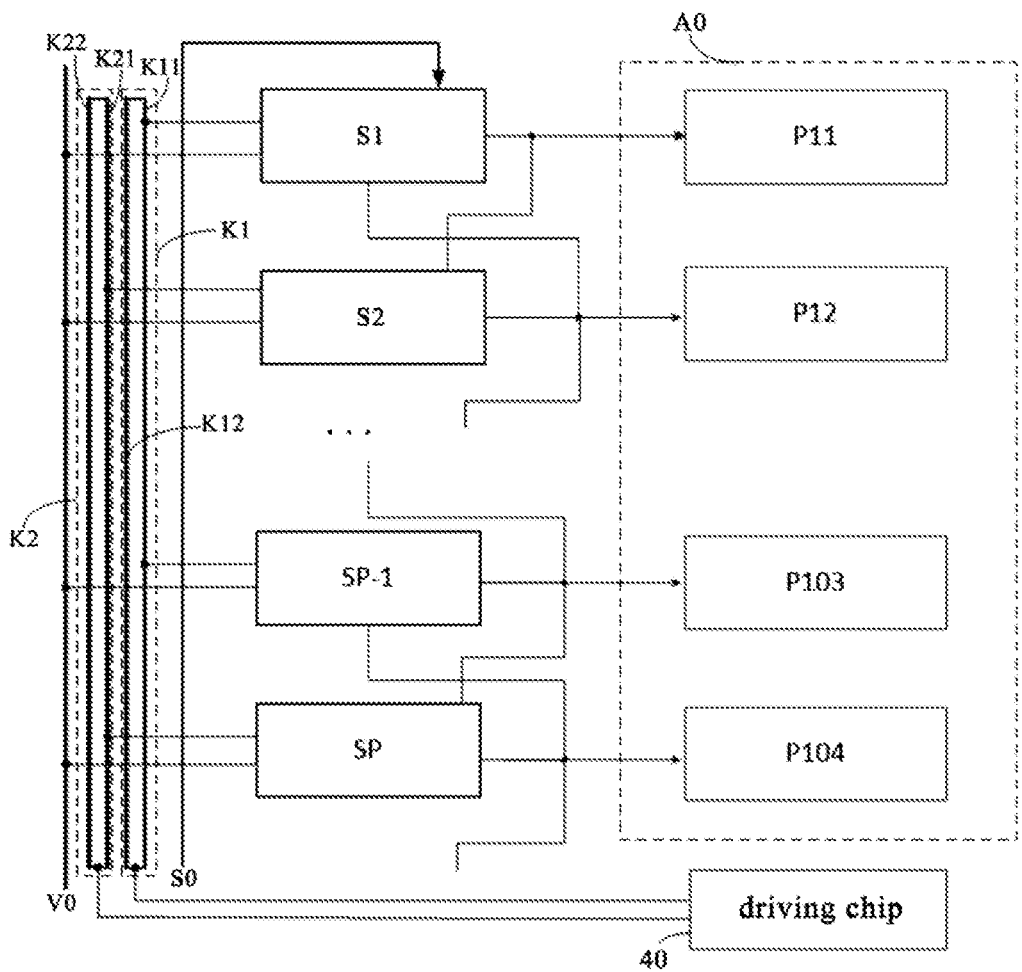
FIG. 3A is a schematic view showing a display panel according to one embodiment of the present disclosure.

As shown in FIG. 3A, the display panel in the embodiments of the present disclosure includes a first driving circuit, a first clock signal line K1 and a second clock signal line which are all arranged a left side of the base substrate.

In FIG. 3A, S1 represents a first-level shift register unit of the first driving circuit, S2 represents a second-level shift register unit of the first driving circuit, SP−1 represents a $(P-1)^{th}$-level shift register unit of the first driving circuit, and SP represents a $P^{th}$-level shift register unit of the first driving circuit, where P is an integer greater than 3.

The first clock signal line K1 includes a first main signal sub-line K11 and a second main signal sub-line K12, and the second clock signal line K2 includes a third main signal sub-line K21 and a fourth main signal sub-line K22. A first end of K11 is a lower end of K11, a second end of K11 is an upper end of K11, a first end of K12 is a lower end of K12, a second end of K12 is an upper end of K12, a first end of K21 is a lower end of K21, a second end of K21 is an upper end of K21, a first end of K22 is a lower end of K22, and a second end of K22 is an upper end of K22. The first end of K11 is electrically coupled to the first end of K12 through a conductive line, the second end of K11 is electrically coupled to the second end of K12 through a conductive line, the first end of K21 is electrically coupled to the first end of K22 through a conductive line, and the second end of K21 is electrically coupled to the second end of K22 through a conductive line.

In FIG. 3A, K1 and K2 are arranged at a side of the first driving circuit away from the display region.

In FIG. 3A, V1 represents a low voltage line, S0 represents a start signal line, and the signal line includes the first clock signal line K1 and the second clock signal line K2.

As shown in FIG. 3A, K11 is directly electrically coupled to S1 and SP−1, and configured to provide a first clock signal to S1 and SP−1. K21 is directly electrically coupled to S2 and SP, and configured to provide a second clock signal to S2 and SP. V1 is electrically coupled to S1, S2, SP−1 and SP, and configured to provide a low voltage signal to S1, S2, SP−1 and SP. S0 is electrically coupled to S1, and configured to provide a start signal to S1.

In FIG. 3A, the first driving circuit is, but not limited to, a first gate driving circuit, and the signal provided by the first driving circuit is, but not limited to, a gate driving signal.

In addition, in FIG. 3A, the first end is a proximal end, and the second end is a distal end. The proximal end is an end of the signal line closer to the driving chip, and the distal end is an end of the signal line further away from the driving chip.

As shown in FIG. 3A, the driving chip 40 is arranged at a lower side of the display panel, and configured to provide the first clock signal to K1 and provide the second clock signal to K2. In FIG. 3A, P11 represents pixel circuits in a first row at a display region A0, P12 represents pixel circuits in a second row at the display region A0, P103 represents pixel circuits in a $(P-1)^{th}$ row at the display region, and P104 represents pixel circuits in a $P^{th}$ row at the display region A0. S1 provides a gate driving signal for P11, S2 provides a gate driving signal for P12, SP−1 provides a gate driving signal for P103, and SP provides a gate driving signal for P104.

Figure 3B:
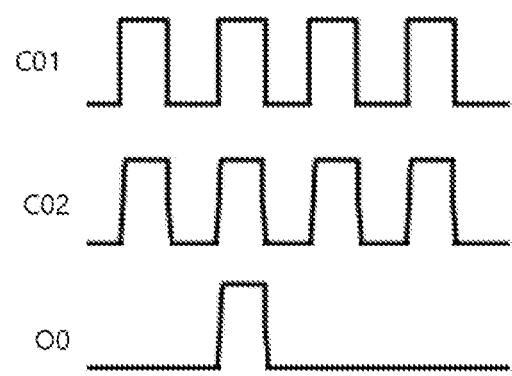
FIG. 3B is an waveform of an input clock signal C01 provided by a driving chip 40 to a first clock signal line K1 via a first end of K1, a clock signal C02 from a second end of K1, and a gate driving signal O0 from a first-level shift register unit S1 of a first driving circuit in the display panel in FIG. 3A.

As shown in FIG. 3B, C01 represents a clock signal inputted by the driving chip 40 to K1 through the first end of K1, C02 represents a clock signal outputted to the second end of K1, and O0 represents a gate driving signal outputted by S1. As shown in FIG. 3B, O0 has a short fall time.

As shown in FIG. 3A, each clock signal line includes two main signal sub-lines. One main signal sub-line is not directly electrically coupled to the driving circuit, and a parasitic capacitance of the main signal sub-line is very small. In this way, it is able to prevent the clock signal outputted by the clock signal line at the distal end from being distorted, thereby to remarkably reduce the fall time Tf of the gate driving signal outputted by the shift register unit electrically coupled to a portion of the clock signal line adjacent to the distal end, and increase the charging time.

In the embodiments of the present disclosure as shown in FIG. 3A, the fall time Tf of the gate driving signal from the shift register unit is reduced mainly for the following two reasons.

For a first reason, the clock signal line includes two main signal sub-lines coupled in parallel to each other, so to reduce the resistance of the clock signal line.

For a second reason, one main signal sub-line of the clock signal line is not directly electrically coupled to the driving circuit, and it is not electrically coupled to an output transistor in the shift register unit, so the capacitance of the main signal sub-line is substantially omitted (there is merely a small overlapping capacitance between the main signal sub-line and the other signal line). Hence, the main signal sub-line not directly electrically coupled to the driving circuit has a very small RC delay, and the clock signal from the clock signal line is substantially not distorted even at the distal end.

During the implementation, K11 and K12 are arranged at a same conductive layer, or at different conductive layers. K21 and K22 are arranged at a same conductive layer, or at different conductive layers.

During the implementation, the display panel includes, but not limited to, six clock signal lines.

Figure 4:
FIG. 4 is a schematic view showing the layout of a gate metal layer in the display panel according to one embodiment of the present disclosure.
Figure 5:
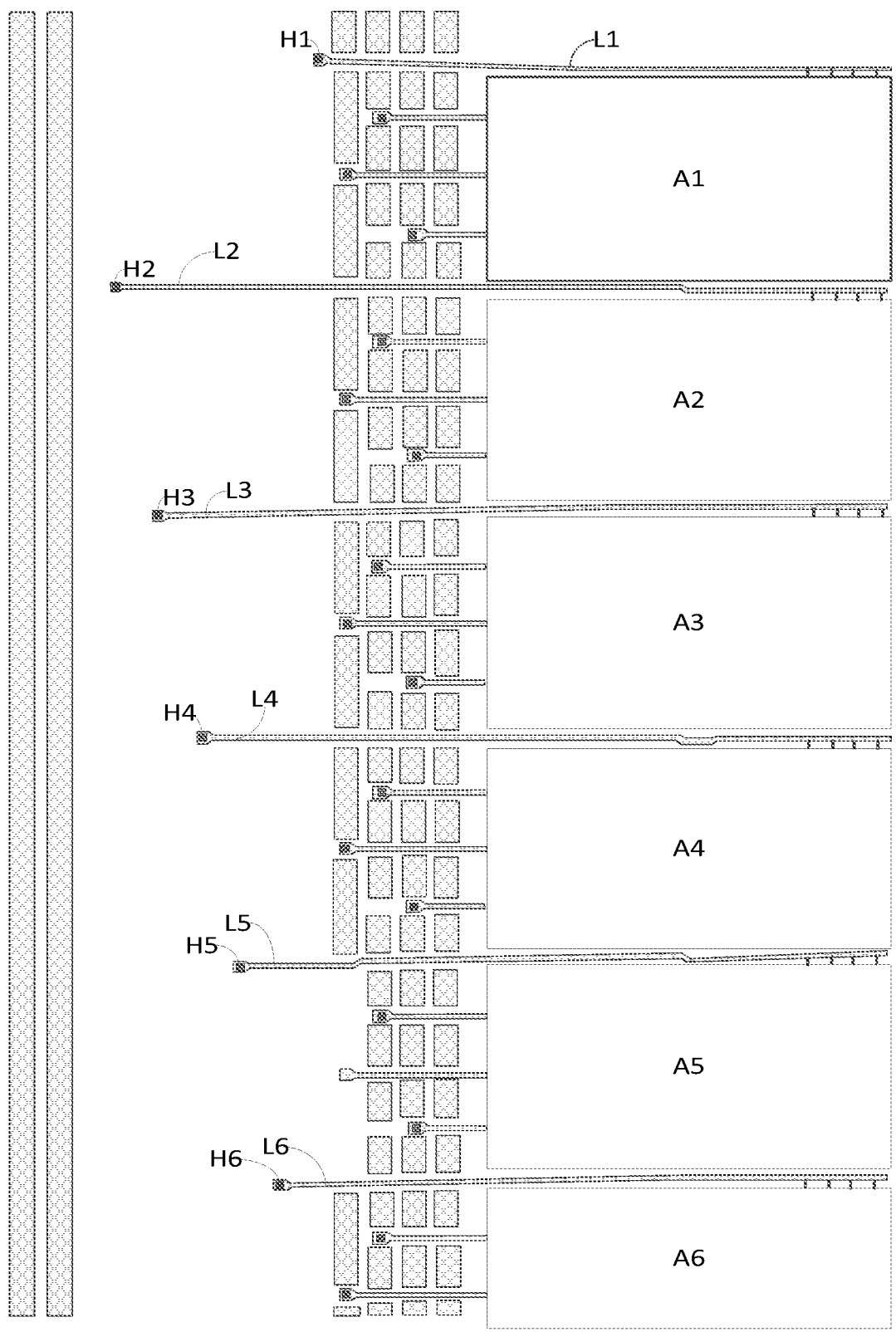
FIG. 5 is a schematic view showing the layout of a source-drain metal layer (with via-holes) in the display panel according to one embodiment of the present disclosure.
Figure 6:
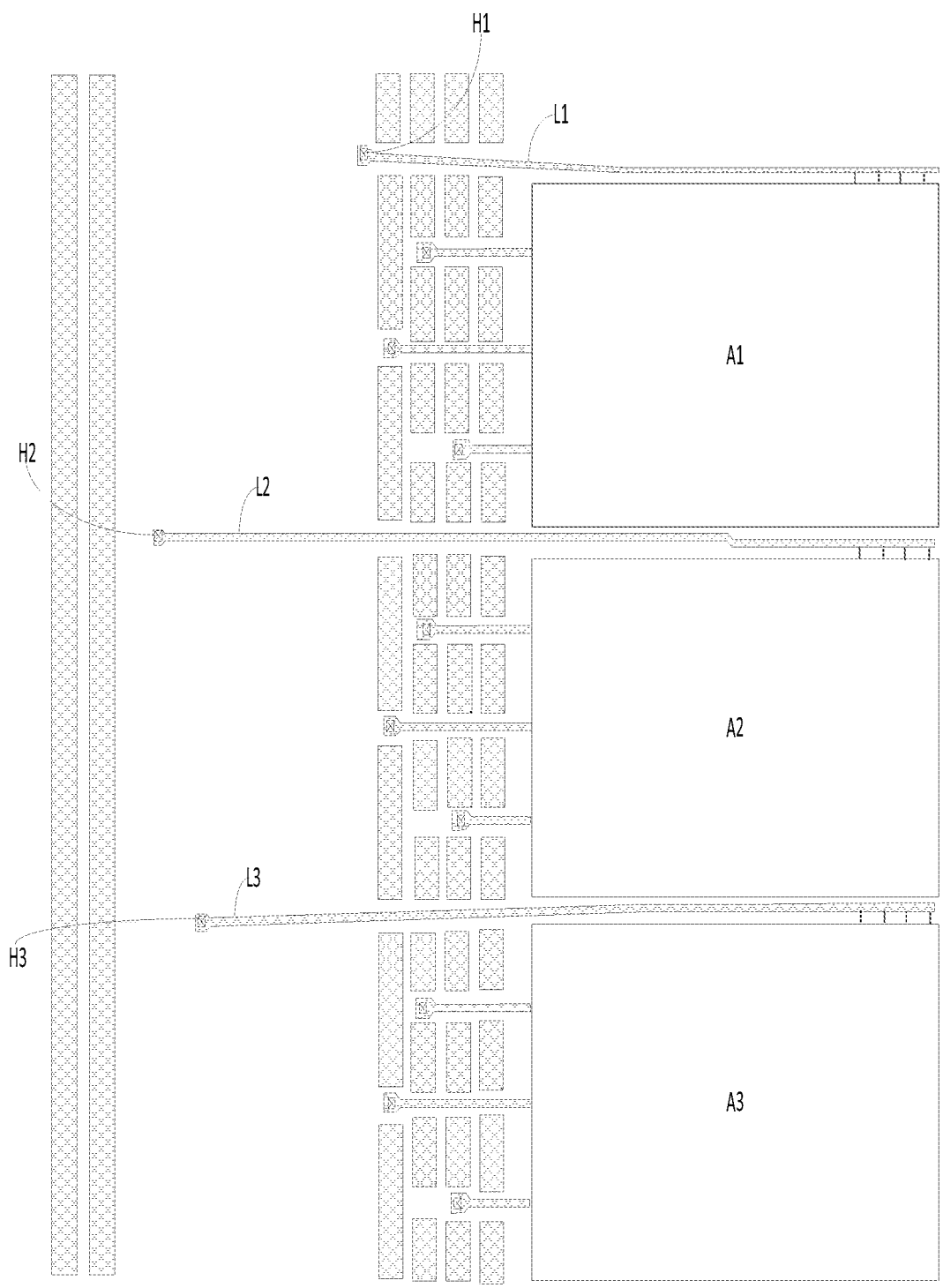
FIG. 6 is a schematic view showing an upper half portion in FIG. 5.
Figure 7:
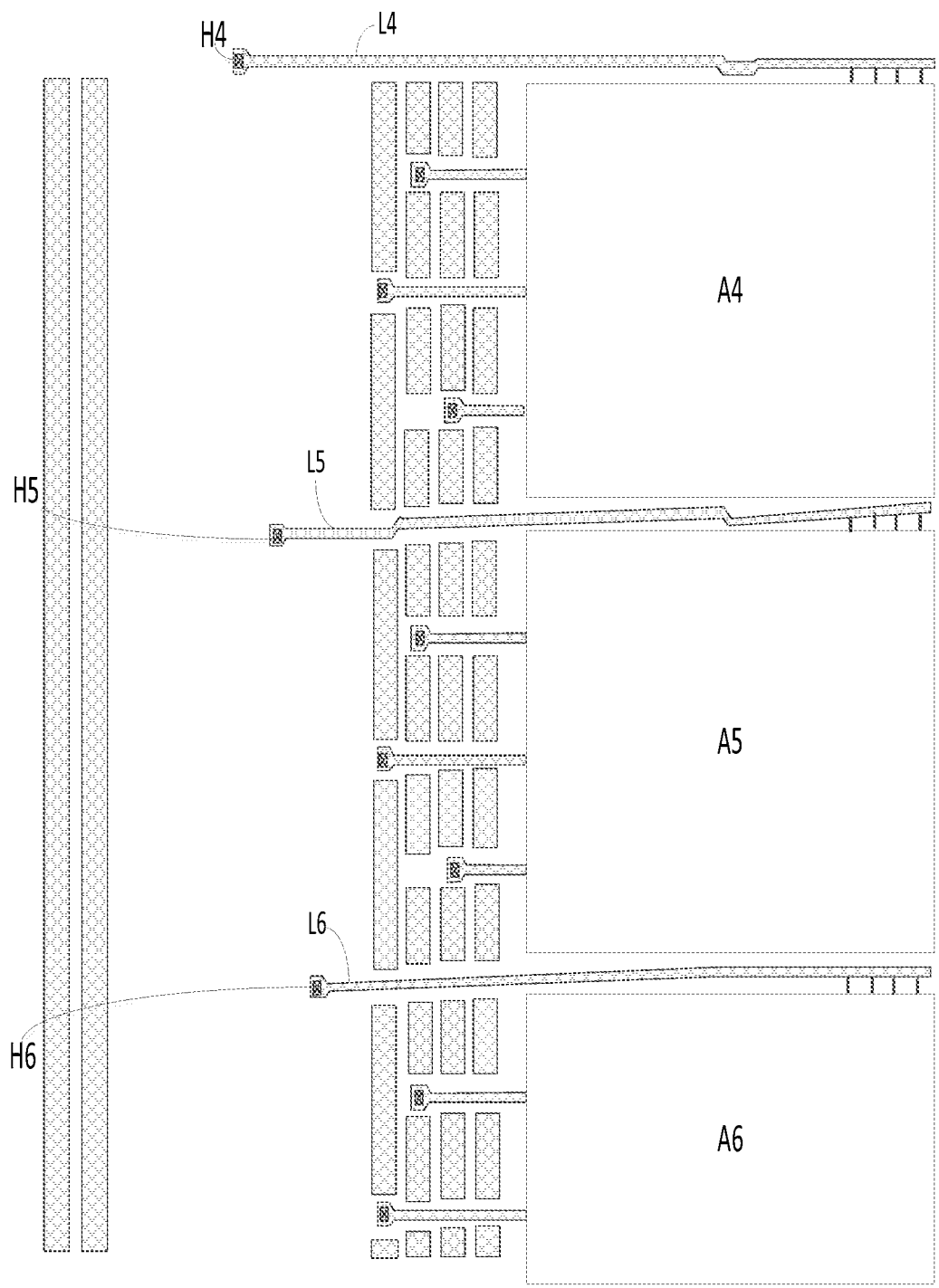
FIG. 7 is a schematic view showing a lower half portion in FIG. 5.
Figure 8:
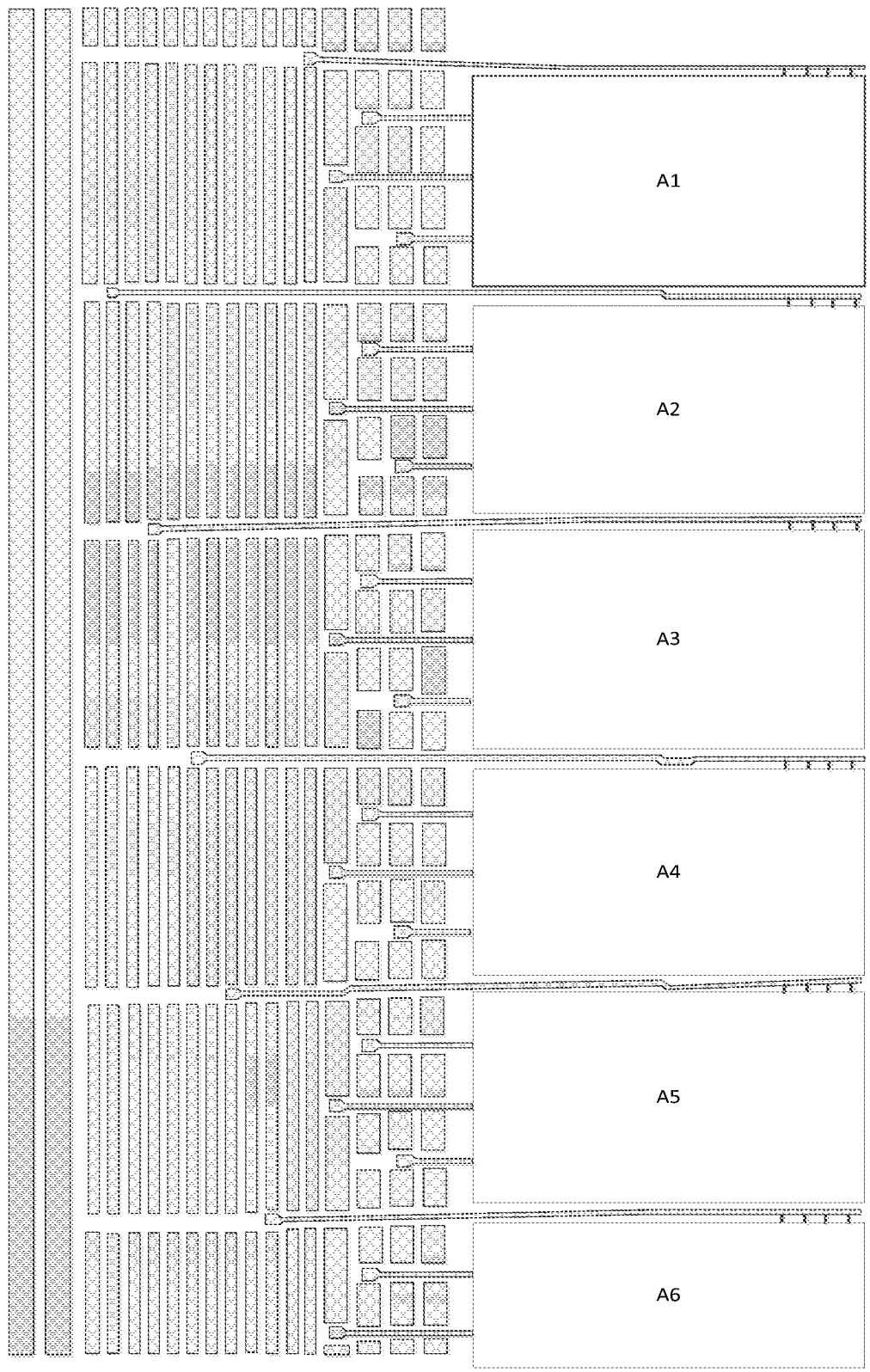
FIG. 8 is another schematic view showing the layout of the source-drain metal layer in the display panel according to one embodiment of the present disclosure.

FIG. 4 is a schematic view showing the layout of the gate metal layer in the display panel, FIG. 5 is a schematic view showing the layout of the source-drain metal layer in the display panel, and FIG. 8 is another schematic view showing the layout of the source-drain metal layer in the display panel.

As shown in FIGS. 4 to 12, the display panel in the embodiments of the present disclosure includes a first driving circuit, a first clock signal line, a second clock signal line, a third clock signal line, a fourth clock signal line, a fifth clock signal line and a sixth clock signal line.

As shown in FIG. 4, the first clock signal line includes a first main signal sub-line K11 and a second main signal sub-line K12, the second clock signal line includes a third main signal sub-line K21 and a fourth main signal sub-line K22, the third clock signal line includes a fifth main signal sub-line K31 and a sixth main signal sub-line K32, the fourth clock signal line includes a seventh main signal sub-line K41 and an eighth main signal sub-line K42, the fifth clock signal line includes a ninth main signal sub-line KM and a tenth main signal sub-line K52, and the sixth clock signal line includes an eleventh main signal sub-line K61 and a twelfth main signal sub-line K62.

As shown in FIG. 4, K11, K12, K21, K22, K31, K32, K41, K42, K51, K52, K61 and K62 are formed at the gate metal layer.

In FIGS. 4 to 12, A1 represents a first driving circuit region, A2 represents a second driving circuit region, A3 represents a third driving circuit region, A4 represents a fourth driving circuit region, A5 represents a fifth driving circuit region, and A6 represents a sixth driving circuit region.

A $(6B-5)^{th}$-level shift register unit of the first driving circuit is arranged at the first driving circuit region A1, a $(6B-4)^{th}$-level shift register unit of the first driving circuit is arranged at the second driving circuit region A2, a $(6B-3)^{th}$-level shift register unit of the first driving circuit is arranged at the third driving circuit region A3, a $(6B-2)^{th}$-level shift register unit of the first driving circuit is arranged at the fourth driving circuit region A4, a $(6B-1)^{th}$-level shift register unit of the first driving circuit is arranged at the fifth driving circuit region A5, and a part of a $(6B)^{th}$-level shift register unit of the first driving circuit is arranged at the sixth driving circuit region A6, where B is a positive integer.

As shown in FIGS. 4 to 12, K11 is electrically coupled to a first connection line L1 through a first via-hole H1, L1 is formed at the source-drain metal layer, and L1 is electrically coupled to the $(6B-5)^{th}$-level shift register unit at A1. K61 is electrically coupled to a second connection line L2 through a second via-hole H2, L2 is formed at the source-drain metal layer, and L2 is electrically coupled to the $(6B-4)^{th}$-level shift register unit at A2. KM is electrically coupled to a third connection line L3 through a third via-hole H3, L3 is formed at the source-drain metal layer, and L3 is electrically coupled to the $(6B-3)^{th}$-level shift register unit at A3. K41 is electrically coupled to a fourth connection line L4 through a fourth via-hole H4, L4 is formed at the source-drain metal layer, and L4 is electrically coupled to the (6B−2)$^{th}$-level shift register unit at A4. K31 is electrically coupled to a fifth connection line L5 through a fifth via-hole H5, L5 is formed at the source-drain metal layer, and L5 is electrically coupled to the (6B−1)$^{th}$-level shift register unit at A5. K21 is electrically coupled to a sixth connection line L6 through a sixth via-hole H6, L6 is formed at the source-drain metal layer, and L6 is electrically coupled to the (6B)$^{th}$-level shift register unit at A6.

As shown in FIGS. 5 and 8-12, any two of L1, L2, L3, L4, L5 and L6 do not overlap each other.

The layout of the source-drain metal layer in FIG. 5 differs from that in FIG. 8 in that no auxiliary signal sub-line is provided in the layout of the source-drain metal layer in FIG. 5.

As shown in FIGS. 8 to 12, the first clock signal line further includes a first auxiliary signal sub-line, a second auxiliary signal sub-line, a third auxiliary signal sub-line, a fourth auxiliary signal sub-line, a fifth auxiliary signal sub-line, a sixth auxiliary signal sub-line, a seventh auxiliary signal sub-line, an eighth auxiliary signal sub-line, a ninth auxiliary signal sub-line, a tenth auxiliary signal sub-line, an eleventh auxiliary signal sub-line and a twelfth auxiliary signal sub-line. The first to twelfth auxiliary signal sub-lines are formed at the source-drain metal layer.

The first auxiliary signal sub-line includes a first one of first auxiliary line portions L011, a second one of first auxiliary line portions L012, a third one of first auxiliary line portions L013, a fourth one of first auxiliary line portions L014, a fifth one of first auxiliary line portions L015, a sixth one of first auxiliary line portions L016 and a seventh one of first auxiliary line portions L017.

The second auxiliary signal sub-line includes a first one of second auxiliary line portions L021, a second one of second auxiliary line portions L022, a third one of second auxiliary line portions L023, a fourth one of second auxiliary line portions L024, a fifth one of second auxiliary line portions L025, a sixth one of second auxiliary line portions L026 and a seventh one of second auxiliary line portions L027.

The third auxiliary signal sub-line includes a first one of third auxiliary line portions L031, a second one of third auxiliary line portions L032, a third one of third auxiliary line portions L033, a fourth one of third auxiliary line portions L034, a fifth one of third auxiliary line portions L035, a sixth one of third auxiliary line portions L036 and a seventh one of third auxiliary line portions L037.

The fourth auxiliary signal sub-line includes a first one of fourth auxiliary line portions L041, a second one of fourth auxiliary line portions L042, a third one of fourth auxiliary line portions L043, a fourth one of fourth auxiliary line portions L044, a fifth one of fourth auxiliary line portions L045, a sixth one of fourth auxiliary line portions L046 and a seventh one of fourth auxiliary line portions L047.

The fifth auxiliary signal sub-line includes a first one of fifth auxiliary line portions L051, a second one of fifth auxiliary line portions L052, a third one of fifth auxiliary line portions L053, a fourth one of fifth auxiliary line portions L054, a fifth one of fifth auxiliary line portions L055, a sixth one of fifth auxiliary line portions L056 and a seventh one of fifth auxiliary line portions L057.

The sixth auxiliary signal sub-line includes a first one of sixth auxiliary line portions L061, a second one of sixth auxiliary line portions L062, a third one of sixth auxiliary line portions L063, a fourth one of sixth auxiliary line portions L064, a fifth one of sixth auxiliary line portions L065, a sixth one of sixth auxiliary line portions L066 and a seventh one of sixth auxiliary line portions L067.

The seventh auxiliary signal sub-line includes a first one of seventh auxiliary line portions L071, a second one of seventh auxiliary line portions L072, a third one of seventh auxiliary line portions L073, a fourth one of seventh auxiliary line portions L074, a fifth one of seventh auxiliary line portions L075, a sixth one of seventh auxiliary line portions L076 and a seventh one of seventh auxiliary line portions L077.

The eighth auxiliary signal sub-line includes a first one of eighth auxiliary line portions L081, a second one of eighth auxiliary line portions L082, a third one of eighth auxiliary line portions L083, a fourth one of eighth auxiliary line portions L084, a fifth one of eighth auxiliary line portions L085, a sixth one of eighth auxiliary line portions L086 and a seventh one of eighth auxiliary line portions L087.

The ninth auxiliary signal sub-line includes a first one of ninth auxiliary line portions L091, a second one of ninth auxiliary line portions L092, a third one of ninth auxiliary line portions L093, a fourth one of ninth auxiliary line portions L094, a fifth one of ninth auxiliary line portions L095, a sixth one of ninth auxiliary line portions L096 and a seventh one of ninth auxiliary line portions L097.

The tenth auxiliary signal sub-line includes a first one of tenth auxiliary line portions L101, a second one of tenth auxiliary line portions L102, a third one of tenth auxiliary line portions L103, a fourth one of tenth auxiliary line portions L104, a fifth one of tenth auxiliary line portions L105, a sixth one of tenth auxiliary line portions L106 and a seventh one of tenth auxiliary line portions L107.

The eleventh auxiliary signal sub-line includes a first one of eleventh auxiliary line portions L111, a second one of eleventh auxiliary line portions L112, a third one of eleventh auxiliary line portions L113, a fourth one of eleventh auxiliary line portions L114, a fifth one of eleventh auxiliary line portions L115, a sixth one of eleventh auxiliary line portions L116 and a seventh one of eleventh auxiliary line portions L117.

The twelfth auxiliary signal sub-line includes a first one of twelfth auxiliary line portions L121, a second one of twelfth auxiliary line portions L122, a third one of twelfth auxiliary line portions L123, a fourth one of twelfth auxiliary line portions L124, a fifth one of twelfth auxiliary line portions L125, a sixth one of twelfth auxiliary line portions L126 and a seventh one of twelfth auxiliary line portions L127.

The first one of first auxiliary line portion L011, the second one of first auxiliary line portion L012, the third one of first auxiliary line portion L013, the fourth one of first auxiliary line portion L014, the fifth one of first auxiliary line portion L015, the sixth one of first auxiliary line portion L016 and the seventh one of first auxiliary line portion L017 are electrically coupled to K11 through via-holes, so that the first auxiliary signal sub-line is electrically coupled to K11.

The first one of second auxiliary line portion L021, the second one of second auxiliary line portion L022, the third one of second auxiliary line portion L023, the fourth one of second auxiliary line portion L024, the fifth one of second auxiliary line portion L025, the sixth one of second auxiliary line portion L026 and the seventh one of second auxiliary line portion L027 are electrically coupled to K12 through via-holes.

The first one of third auxiliary line portion L031, the second one of third auxiliary line portion L032, the third one of third auxiliary line portion L033, the fourth one of third auxiliary line portion L034, the fifth one of third auxiliary line portion L035, the sixth one of third auxiliary line portion L036 and the seventh one of third auxiliary line portion L037 are electrically coupled to K21 through via-holes.

The first one of fourth auxiliary line portion L041, the second one of fourth auxiliary line portion L042, the third one of fourth auxiliary line portion L043, the fourth one of fourth auxiliary line portion L044, the fifth one of fourth auxiliary line portion L045, the sixth one of fourth auxiliary line portion L046 and the seventh one of fourth auxiliary line portion L047 are electrically coupled to K22 through via-holes.

The first one of fifth auxiliary line portion L051, the second one of fifth auxiliary line portion L052, the third one of fifth auxiliary line portion L053, the fourth one of fifth auxiliary line portion L054, the fifth one of fifth auxiliary line portion L055, the sixth one of fifth auxiliary line portion L056 and the seventh one of fifth auxiliary line portion L057 are electrically coupled to K31 through via-holes.

The first one of sixth auxiliary line portion L061, the second one of sixth auxiliary line portion L062, the third one of sixth auxiliary line portion L063, the fourth one of sixth auxiliary line portion L064, the fifth one of sixth auxiliary line portion L065, the sixth one of sixth auxiliary line portion L066 and the seventh one of sixth auxiliary line portion L067 are electrically coupled to K32 through via-holes.

The first one of seventh auxiliary line portion L071, the second one of seventh auxiliary line portion L072, the third one of seventh auxiliary line portion L073, the fourth one of seventh auxiliary line portion L074, the fifth one of seventh auxiliary line portion L075, the sixth one of seventh auxiliary line portion L076 and the seventh one of seventh auxiliary line portion L077 are electrically coupled to K41 through via-holes.

The first one of eighth auxiliary line portion L081, the second one of eighth auxiliary line portion L082, the third one of eighth auxiliary line portion L083, the fourth one of eighth auxiliary line portion L084, the fifth one of eighth auxiliary line portion L085, the sixth one of eighth auxiliary line portion L086 and the seventh one of eighth auxiliary line portion L087 are electrically coupled to K42 through via-holes.

The first one of ninth auxiliary line portion L091, the second one of ninth auxiliary line portion L092, the third one of ninth auxiliary line portion L093, the fourth one of ninth auxiliary line portion L094, the fifth one of ninth auxiliary line portion L095, the sixth one of ninth auxiliary line portion L096 and the seventh one of ninth auxiliary line portion L097 are electrically coupled to K51 through via-holes.

The first one of tenth auxiliary line portion L101, the second one of tenth auxiliary line portion L102, the third one of tenth auxiliary line portion L103, the fourth one of tenth auxiliary line portion L104, the fifth one of tenth auxiliary line portion L105, the sixth one of tenth auxiliary line portion L106 and the seventh one of tenth auxiliary line portion L107 are electrically coupled to K52 through via-holes.

The first one of eleventh auxiliary line portion L111, the second one of eleventh auxiliary line portion L112, the third one of eleventh auxiliary line portion L113, the fourth one of eleventh auxiliary line portion L114, the fifth one of eleventh auxiliary line portion L115, the sixth one of eleventh auxiliary line portion L116 and the seventh one of eleventh auxiliary line portion L117 are electrically coupled to K61 through via-holes.

The first one of twelfth auxiliary line portion L121, the second one of twelfth auxiliary line portion L122, the third one of twelfth auxiliary line portion L123, the fourth one of twelfth auxiliary line portion L124, the fifth one of twelfth auxiliary line portion L125, the sixth one of twelfth auxiliary line portion L126 and the seventh one of twelfth auxiliary line portion L127 are electrically coupled to K62 through via-holes.

In FIGS. 5-7 and 10-12, each box with "x" represents a via-hole.

In the embodiments of the present disclosure as shown in FIGS. 4-7, the main signal sub-lines are formed at the gate metal layer, the connection lines are formed at the source-drain metal layer, an insulation layer is arranged between the gate metal layer and the source-drain metal layer, the via-holes H1, H2, H3, H4, H5 and H6 penetrate through the insulation layer.

In the embodiments of the present disclosure as shown in FIGS. 4 and 8-12, the main signal sub-lines are formed at the gate metal layer, the connection lines and the auxiliary signal sub-lines are formed at the source-drain metal layer, an insulation layer is arranged between the gate metal layer and the source-drain metal layer, the via-holes H1, H2, H3, H4, H5 and H6 penetrate through the insulation layer.

In the embodiments of the present disclosure as shown in FIGS. 4 and 8-12, an orthogonal projection of the first auxiliary signal sub-line onto the base substrate is located within an orthogonal projection of the first main signal sub-line onto the base substrate, an orthogonal projection of the second auxiliary signal sub-line onto the base substrate is located within an orthogonal projection of the second main signal sub-line onto the base substrate, an orthogonal projection of the third auxiliary signal sub-line onto the base substrate is located within an orthogonal projection of the third main signal sub-line onto the base substrate, an orthogonal projection of the fourth auxiliary signal sub-line onto the base substrate is located within an orthogonal projection of the fourth main signal sub-line onto the base substrate, an orthogonal projection of the fifth auxiliary signal sub-line onto the base substrate is located within an orthogonal projection of the fifth main signal sub-line onto the base substrate, and an orthogonal projection of the sixth auxiliary signal sub-line onto the base substrate is located within an orthogonal projection of the sixth main signal sub-line onto the base substrate, so as to increase a thickness of the signal line, thereby to reduce the resistance of the signal line.

Figure 9:
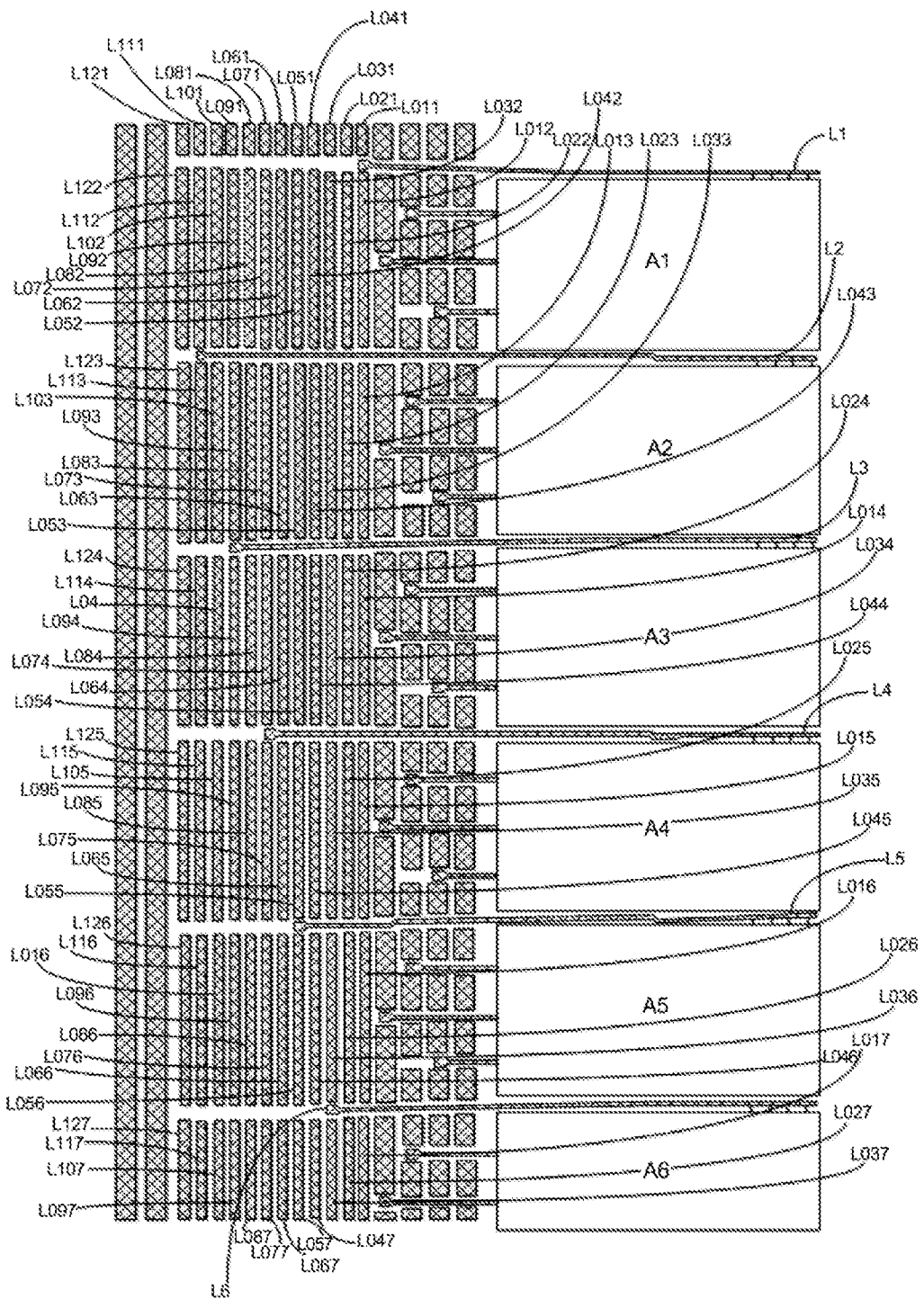
FIG. 9 is a schematic view showing the source-drain metal layer in FIG. 8 with reference numerals.
Figure 10:
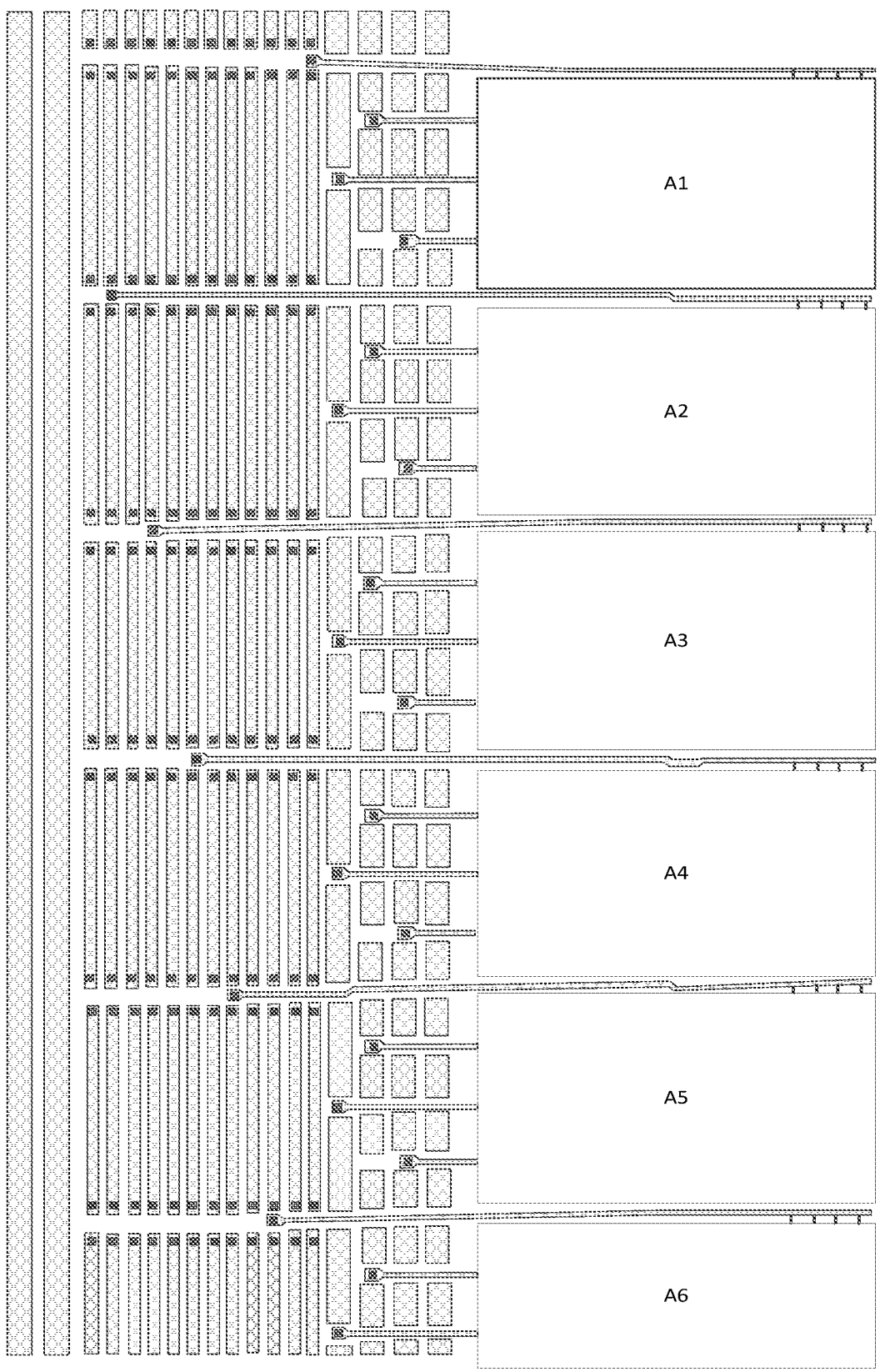
FIG. 10 is a schematic view showing the source-drain metal layer in FIG. 8 with via-holes.

In the embodiments of the present disclosure as shown in FIGS. 4 and 8-12, a gap is provided between two adjacent auxiliary line portions of a same auxiliary signal sub-line. For example, as shown in FIG. 9, a gap is provided between L016 and L017, a gap is provided between L026 and L027, and a gap is provided between L036 and L037. L6 is electrically coupled to the $(6B)^{th}$ level shift register unit at A6 through the gap between L036 and L037, the gap between L026 and L027 and the gap between L016 and L017 sequentially.

In the embodiments of the present disclosure as shown in FIGS. 4 and 8-12, the connection lines and the auxiliary signal sub-lines are formed at the source-drain metal layer, and the connection lines do not overlap the auxiliary signal sub-lines, so as to prevent the occurrence of signal interference.

In the embodiments of the present disclosure as shown in FIGS. 4 and 8-12, the auxiliary line portions of each auxiliary signal sub-line are electrically coupled to a corresponding main signal sub-line through two via-holes, one of the two via-holes is formed at a position adjacent to a lower end of the auxiliary line portion, and the other one of the two via-holes is formed at a position adjacent to an upper end of the auxiliary line portion, so as to enable the auxiliary signal sub-line to be coupled in parallel to the corresponding main signal sub-line, thereby to further reduce the resistance of the signal line.

Figure 11:
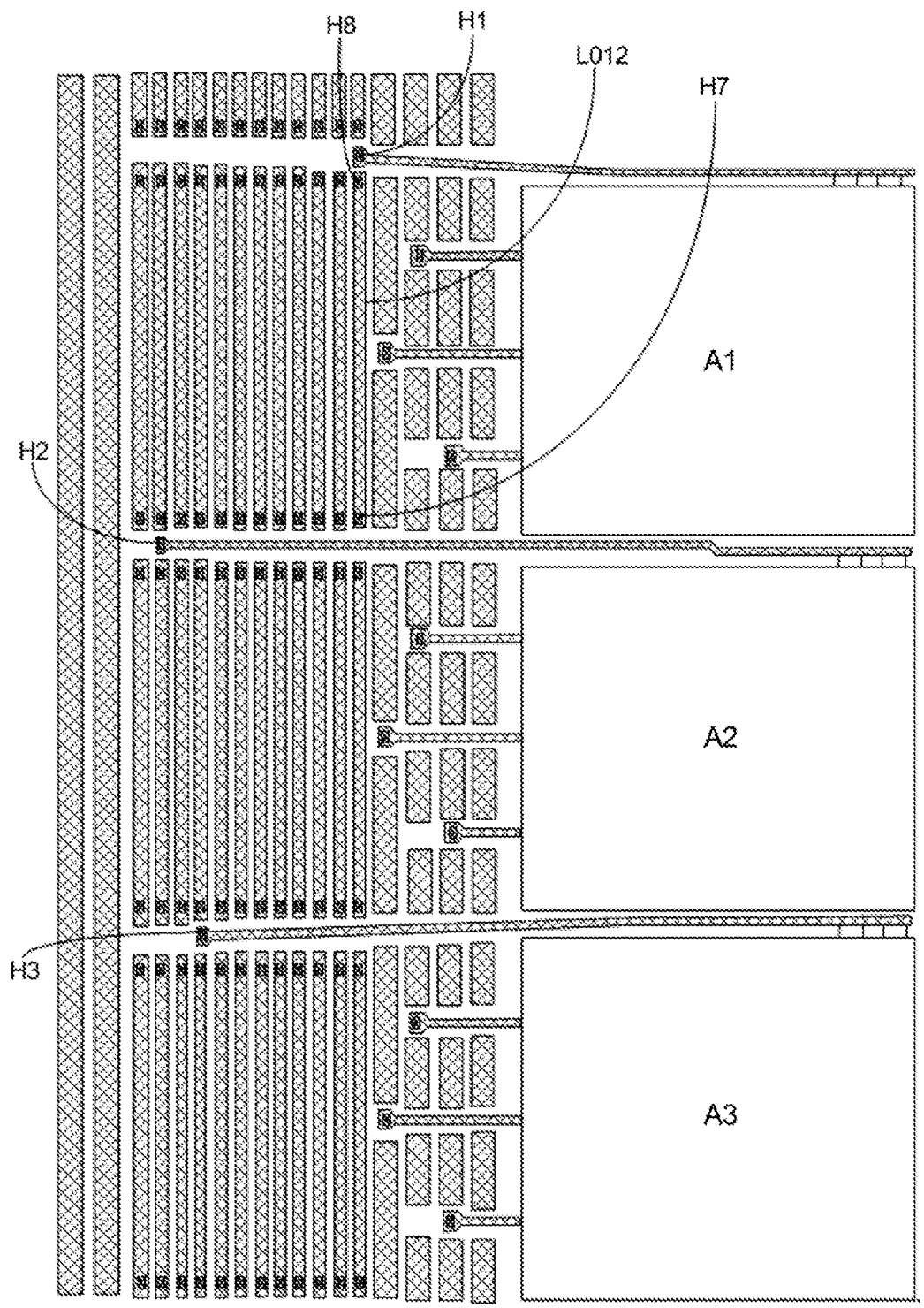
FIG. 11 is a schematic view showing an upper half portion in FIG. 10.
Figure 12:
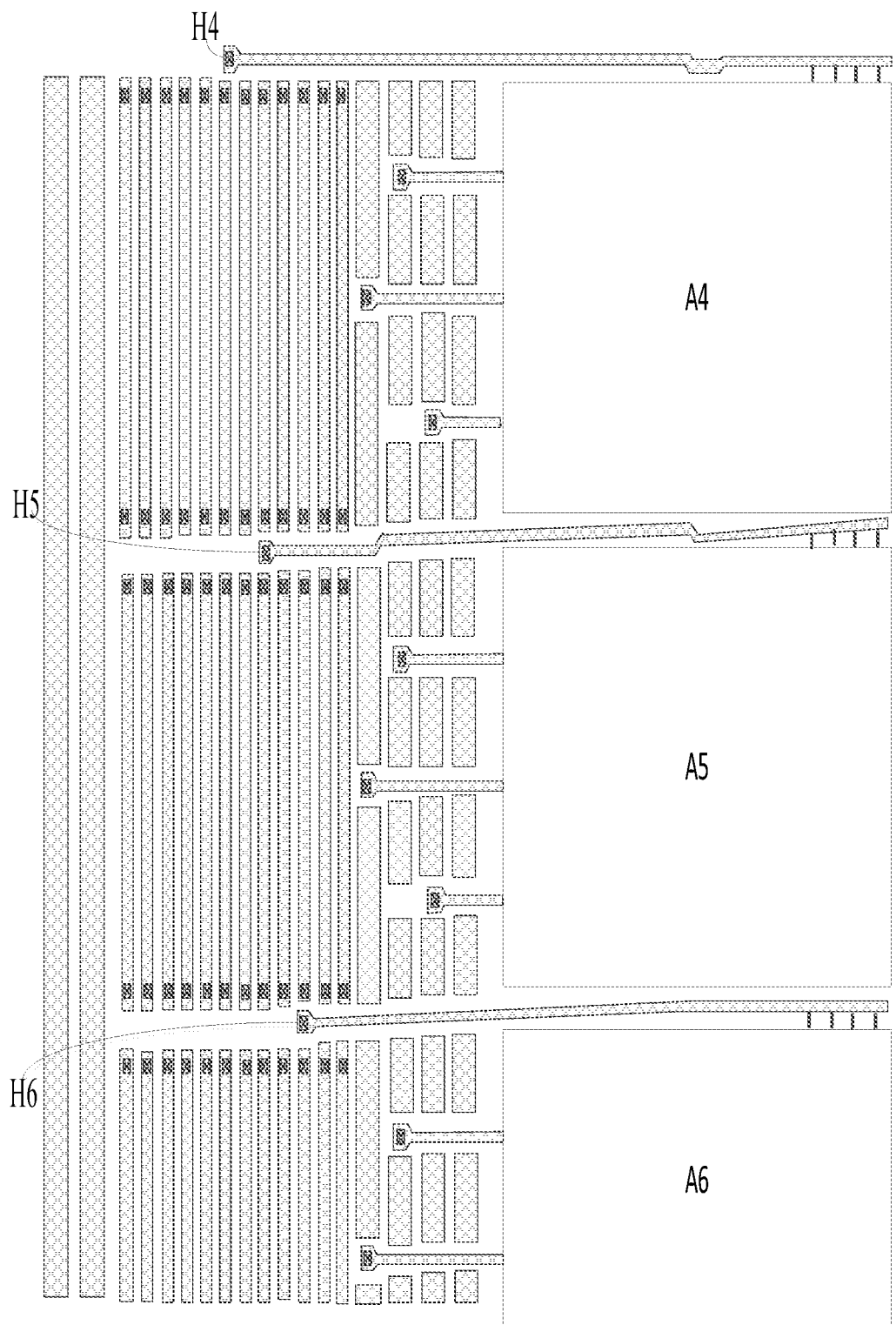
FIG. 12 is a schematic view showing a lower half portion in FIG. 10.

As shown in FIG. 11, H7 represents a seventh via-hole, and H8 represents an eighth via-hole.

As shown in FIGS. 4 and 11, L012 is electrically coupled to K11 through H7 and H8, an orthogonal projection of H7 onto the base substrate is arranged close to a lower end of an orthogonal projection of L012 onto the base substrate, and an orthogonal projection of H8 onto the base substrate is arranged close to an upper end of the orthogonal projection of L012 onto the base substrate.

In the embodiments of the present disclosure as shown in FIGS. 13 to 16, A1 represents a first driving circuit region, A2 represents a second driving circuit region, A3 represents a third driving circuit region, A4 represents a fourth driving circuit region, and A5 represents a fifth driving circuit region.

A first-level shift register unit of the first driving circuit is arranged at the first driving circuit region A1, a second-level shift register unit of the first driving circuit is arranged at the second driving circuit region A2, a third-level shift register unit of the first driving circuit is arranged at the third driving circuit region A3, a fourth-level shift register unit of the first driving circuit is arranged at the fourth driving circuit region A4, and a fifth-level shift register unit of the first driving circuit is arranged at the fifth driving circuit region A5.

Figure 13:
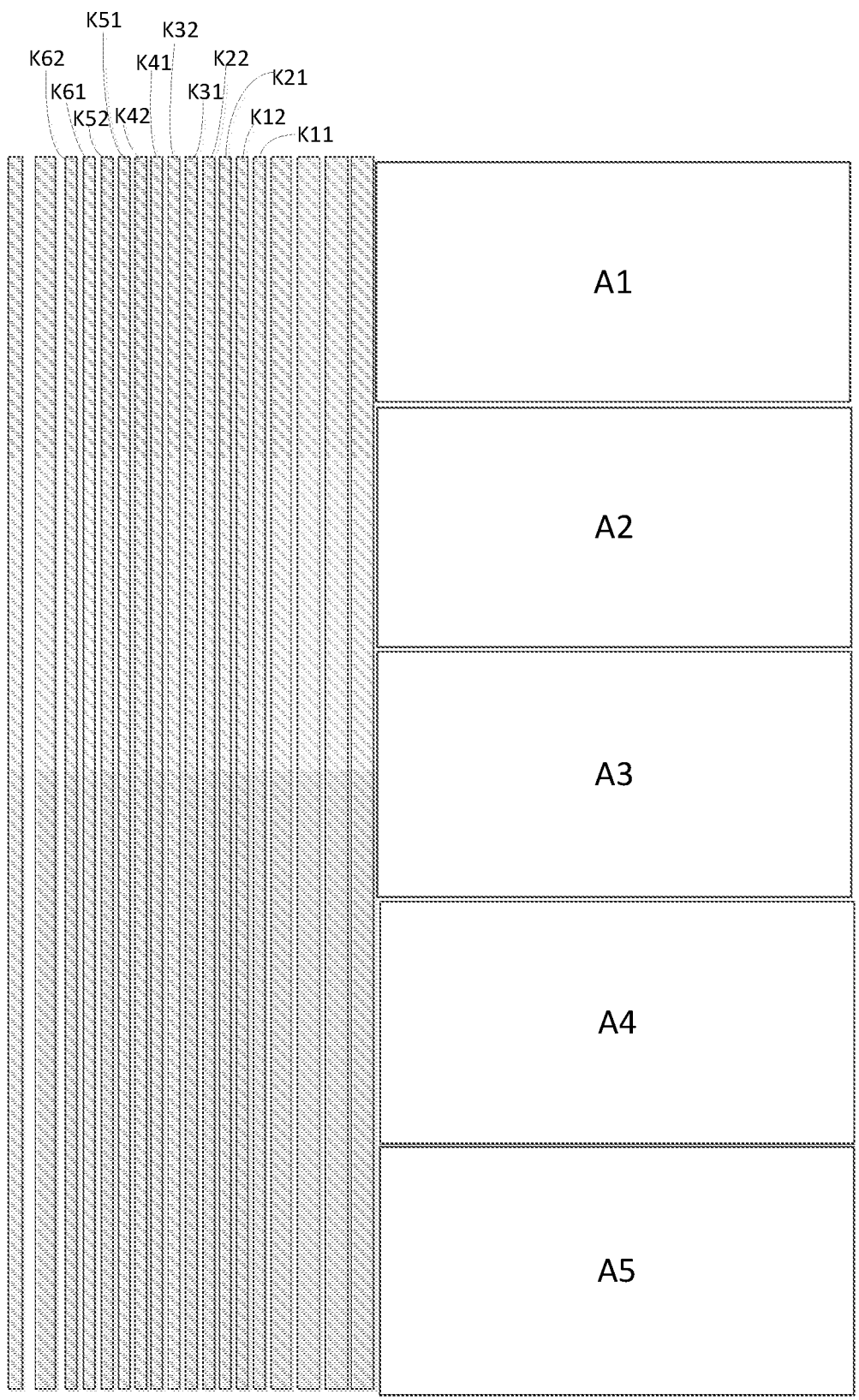
FIG. 13 is another schematic view showing the layout of the gate metal layer in the display panel according to one embodiment of the present disclosure.

As shown in FIG. 13, the display panel in the embodiments of the present disclosure includes a first driving circuit, a first clock signal line, a second clock signal line, a third clock signal line, a fourth clock signal line, a fifth clock signal line and a sixth clock signal line.

As shown in FIG. 13, the first clock signal line includes a first main signal sub-line K11 and a second main signal sub-line K12, the second clock signal line includes a third main signal sub-line K21 and a fourth main signal sub-line K22, the third clock signal line includes a fifth main signal sub-line K31 and a sixth main signal sub-line K32, the fourth clock signal line includes a seventh main signal sub-line K41 and an eighth main signal sub-line K42, the fifth clock signal line includes a ninth main signal sub-line K51 and a tenth main signal sub-line K52, and the sixth clock signal line includes an eleventh main signal sub-line K61 and a twelfth main signal sub-line K62.

As shown in FIG. 13, K11, K12, K21, K22, K31, K32, K41, K42, K51, K52, K61 and K62 are formed at the gate metal layer.

Figure 14:
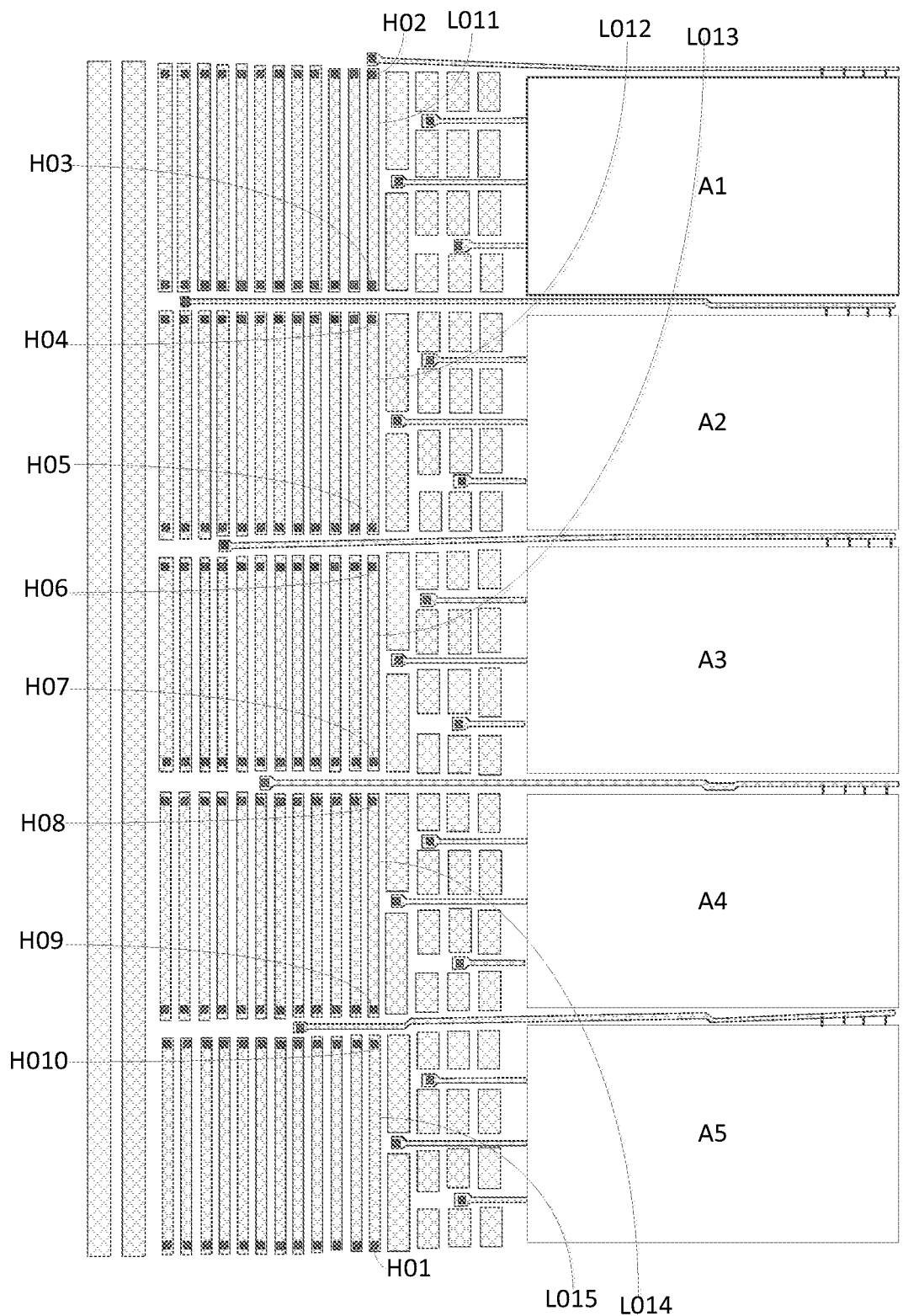
FIG. 14 is yet another schematic view showing the source-drain metal layer in the display panel according to one embodiment of the present disclosure.
Figure 15:
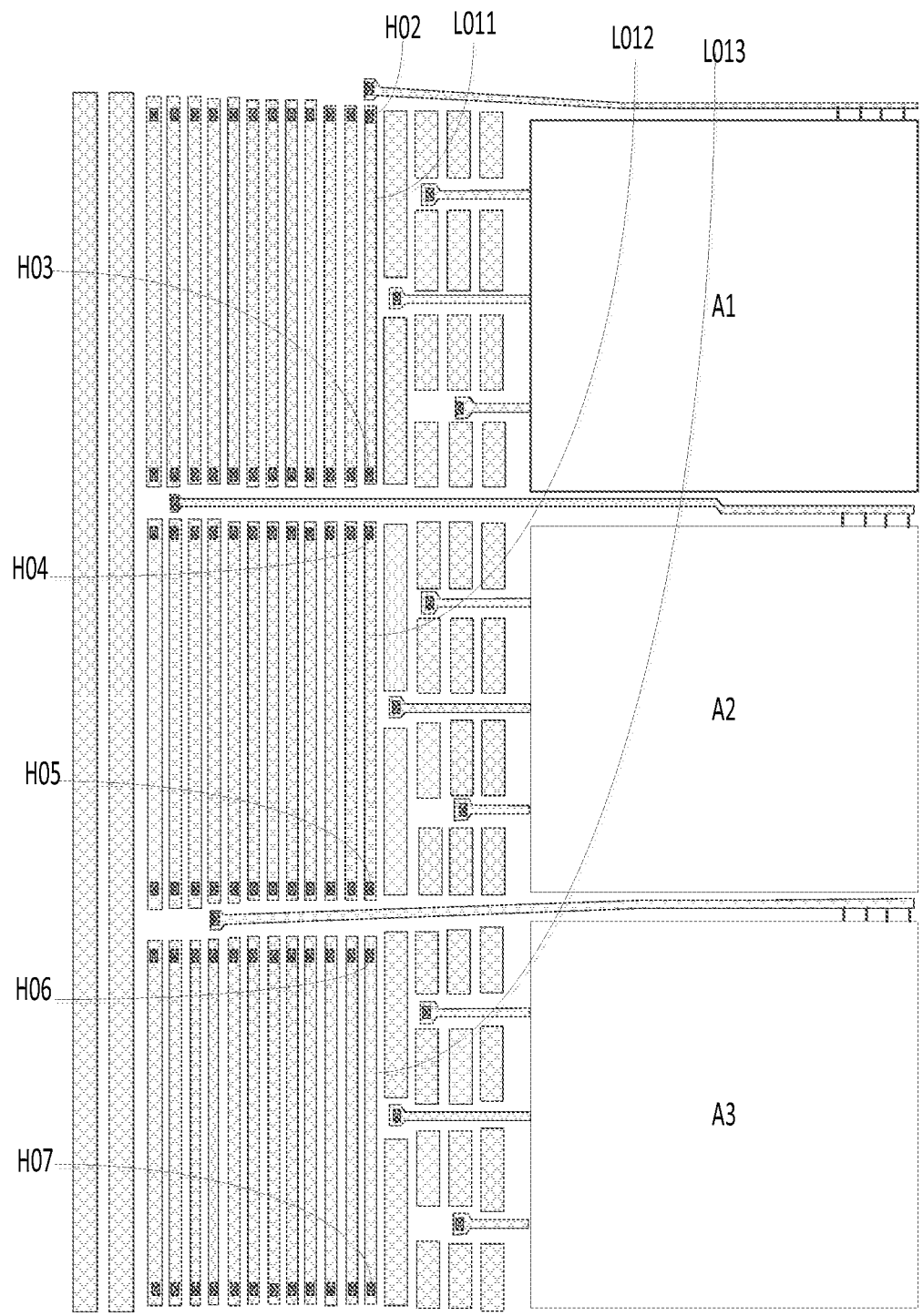
FIG. 15 is a schematic view showing an upper half portion in FIG. 14.
Figure 16:
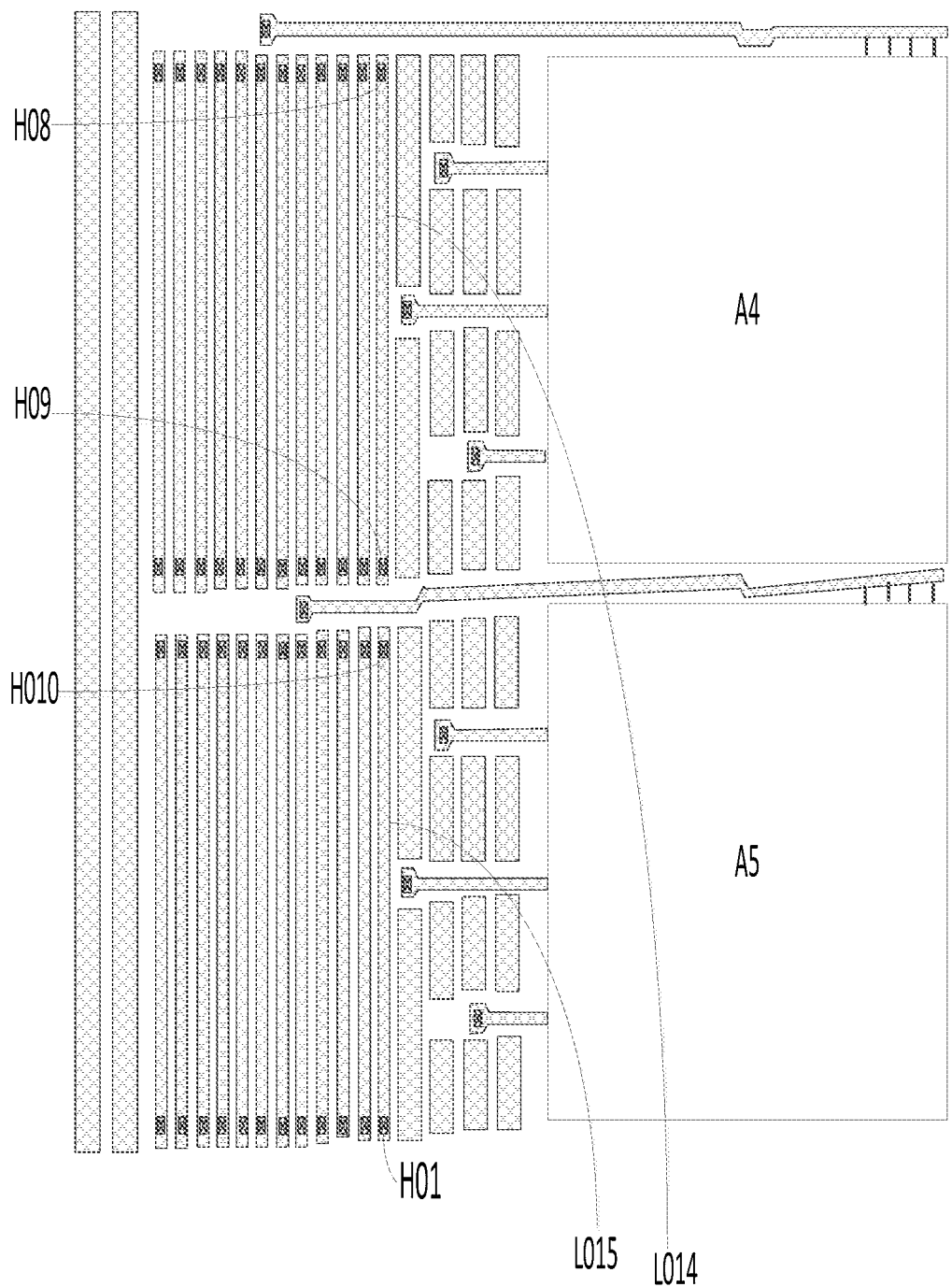
FIG. 16 is a schematic view showing a lower half portion in FIG. 14.

As shown in FIG. 14, the first auxiliary signal sub-line includes a first one of first auxiliary line portions L011, a second one of first auxiliary line portions L012, a third one of first auxiliary line portions L013, a fourth one of first auxiliary line portions L014, and a fifth one of first auxiliary line portions L015, and the first auxiliary signal sub-line is electrically coupled to K11.

In FIG. 14, H01 represents a first connection via-hole, H02 represents a second connection via-hole, H03 represents a third connection via-hole, H04 represents a fourth connection via-hole, H05 represents a fifth connection via-hole, H06 represents a sixth connection via-hole, H07 represents a seventh connection via-hole, H08 represents an eighth connection via-hole, H09 represents a ninth connection via-hole, and H010 represents a tenth connection via-hole.

In FIG. 13, a lower end of K11 is a first end of K11, and an upper end of K11 is a second end of K11.

As shown in FIGS. 13 and 14, the first auxiliary signal sub-line is electrically coupled to K11 through H01 and H02, an orthogonal projection of H01 onto the base substrate is located adjacent to a lower end of an orthogonal projection of K11 onto the base substrate, and an orthogonal projection of H02 onto the base substrate is located adjacent to an upper end of the orthogonal projection of K11 onto the base substrate.

As shown in FIGS. 13 and 14, L011 is electrically coupled to K11 through H02 and H03, L012 is electrically coupled to K11 through H04 and H05, L013 is electrically coupled to K11 through H06 and H07, L014 is electrically coupled to K11 through H08 and H09, and L015 is electrically coupled to K11 through H010 and H01. An orthogonal projection of H02 onto the base substrate is located adjacent to an upper end of an orthogonal projection of L011 onto the base substrate, and an orthogonal projection of H03 onto the base substrate is located adjacent to a lower end of the orthogonal projection of L011 onto the base substrate. An orthogonal projection of H04 onto the base substrate is located adjacent to an upper end of an orthogonal projection of L012 onto the base substrate, and an orthogonal projection of H05 onto the base substrate is located adjacent to a lower end of the orthogonal projection of L012 onto the base substrate. An orthogonal projection of H06 onto the base substrate is located adjacent to an upper end of an orthogonal projection of L013 onto the base substrate, and an orthogonal projection of H07 onto the base substrate is located adjacent to a lower end of the orthogonal projection of L013 onto the base substrate. An orthogonal projection of H08 onto the base substrate is located adjacent to an upper end of an orthogonal projection of L014 onto the base substrate, and an orthogonal projection of H09 onto the base substrate is located adjacent to a lower end of the orthogonal projection of L014 onto the base substrate. An orthogonal projection of H010 onto the base substrate is located adjacent to an upper end of an orthogonal projection of L015 onto the base substrate, and an orthogonal projection of H01 onto the base substrate is located adjacent to a lower end of the orthogonal projection of L015 onto the base substrate.

In the embodiments of the present disclosure as shown in FIGS. 13 to 16, an orthogonal projection of the first auxiliary signal sub-line onto the base substrate is located within an orthogonal projection of K11 onto the base substrate, a distance between the orthogonal projection of H01 onto the base substrate and an orthogonal projection of a lower end of K11 onto the base substrate is small, and a distance between the orthogonal projection of H02 onto the base substrate and an orthogonal projection of an upper end of K11 onto the base substrate is small.

In a possible embodiment of the present disclosure, the display panel includes a first driving circuit, a second driving circuit, a first signal line and a second signal line. The first driving circuit and the first signal line are arranged at a first side of the display panel, the second driving circuit and the second signal line are arranged at a second side of the display panel, and the first side is opposite to the second side.

During the implementation, the display panel includes two driving circuitries and two signal lines, the first driving circuit and the first signal line are arranged at the first side of the display panel, and the second driving circuit and the second signal line are arranged at the second side of the display panel.

In the embodiments of the present disclosure, the quantity of first signal lines is at least one, and the quantity of second signal lines is at least one.

During the implementation, the first signal line is arranged at a side of the first driving circuit away from the display region, or between the first driving circuit and the display region. The second signal line is arranged at a side of the second driving circuit away from the display region, or between the second driving circuit and the display region.

In the embodiments of the present disclosure, the display panel includes a plurality of data lines arranged on the base substrate and at the display region. The extension direction of each main signal sub-line is identical to, or approximately identical to, an extension direction of each data line.

In the embodiments of the present disclosure, when the extension direction of each main signal sub-line is approximately identical to the extension direction of each data line, it means that an angle between the extension direction of each main signal sub-line and the extension direction of each data line is smaller than a predetermined angle.

In a possible embodiment of the present disclosure, the signal line includes a first clock signal line, a second clock signal line, a third clock signal line and a fourth clock signal line. The display panel includes a first driving circuit and a second driving circuit. The first driving circuit, the first clock signal line and the second clock signal line are arranged at one side of the display panel, and the second driving circuit, the third clock signal line and the fourth clock signal line are arranged at the other side of the display panel.

The first clock signal line includes a first main signal sub-line and a second main signal sub-line, the second clock signal line includes a third main signal sub-line and a fourth main signal sub-line, the third clock signal line includes a fifth main signal sub-line and a sixth main signal sub-line, and the fourth clock signal line includes a seventh main signal sub-line and an eighth main signal sub-line.

A first end of the first main signal sub-line is electrically coupled to a first end of the second main signal sub-line through a conductive line, and a second end of the first main signal sub-line is electrically coupled to a second end of the second main signal sub-line through a conductive line. When the first main signal sub-line is coupled in parallel to the second main signal sub-line, it is able to reduce a resistance of the first clock signal line.

A first end of the third main signal sub-line is electrically coupled to a first end of the fourth main signal sub-line through a conductive line, and a second end of the third main signal sub-line is electrically coupled to a second end of the fourth main signal sub-line through a conductive line. When the third main signal sub-line is coupled in parallel to the fourth main signal sub-line, it is able to reduce a resistance of the second clock signal line.

A first end of the fifth main signal sub-line is electrically coupled to a first end of the sixth main signal sub-line through a conductive line, and a second end of the fifth main signal sub-line is electrically coupled to a second end of the sixth main signal sub-line through a conductive line. When the fifth main signal sub-line is coupled in parallel to the sixth main signal sub-line, it is able to reduce a resistance of the third clock signal line.

A first end of the seventh main signal sub-line is electrically coupled to a first end of the eighth main signal sub-line through a conductive line, and a second end of the seventh main signal sub-line is electrically coupled to a second end of the eighth main signal sub-line through a conductive line. When the seventh main signal sub-line is coupled in parallel to the eighth main signal sub-line, it is able to reduce a resistance of the fourth clock signal line.

The first driving circuit includes a plurality of levels of shift register units, and the second driving circuit includes a plurality of levels of shift register units.

The first main signal sub-line is directly electrically coupled to odd-numbered-level shift register units of the first driving circuit, and the third main signal sub-line is directly electrically coupled to even-numbered-level shift register units of the first driving circuit.

The second main signal sub-line is not directly electrically coupled to the shift register unit, and the fourth main signal sub-line is not directly electrically coupled to the shift register unit, so as to provide each of the second main signal sub-line and the fourth main signal sub-line with a very small parasitic capacitance. In this way, it is able to prevent the clock signal outputted by the clock signal line from being distorted at the distal end, thereby to remarkably reduce the fall time Tf of the signal outputted by the shift register unit electrically coupled to a portion of the clock signal line adjacent to the distal end, and increase the charging time.

The fifth main signal sub-line is directly electrically coupled to odd-numbered-level shift register units of the second driving circuit, and the seventh main signal sub-line is directly electrically coupled to even-numbered-level shift register units of the second driving circuit.

The sixth main signal sub-line is not directly electrically coupled to the shift register unit, and the eighth main signal sub-line is not directly electrically coupled to the shift register unit, so as to provide each of the sixth main signal sub-line and the eighth main signal sub-line with a very small parasitic capacitance. In this way, it is able to prevent the clock signal outputted by the clock signal line from being distorted at the distal end, thereby to remarkably reduce the fall time Tf of the signal outputted by the shift register unit electrically coupled to a portion of the clock signal line adjacent to the distal end, and increase the charging time.

Figure 17:
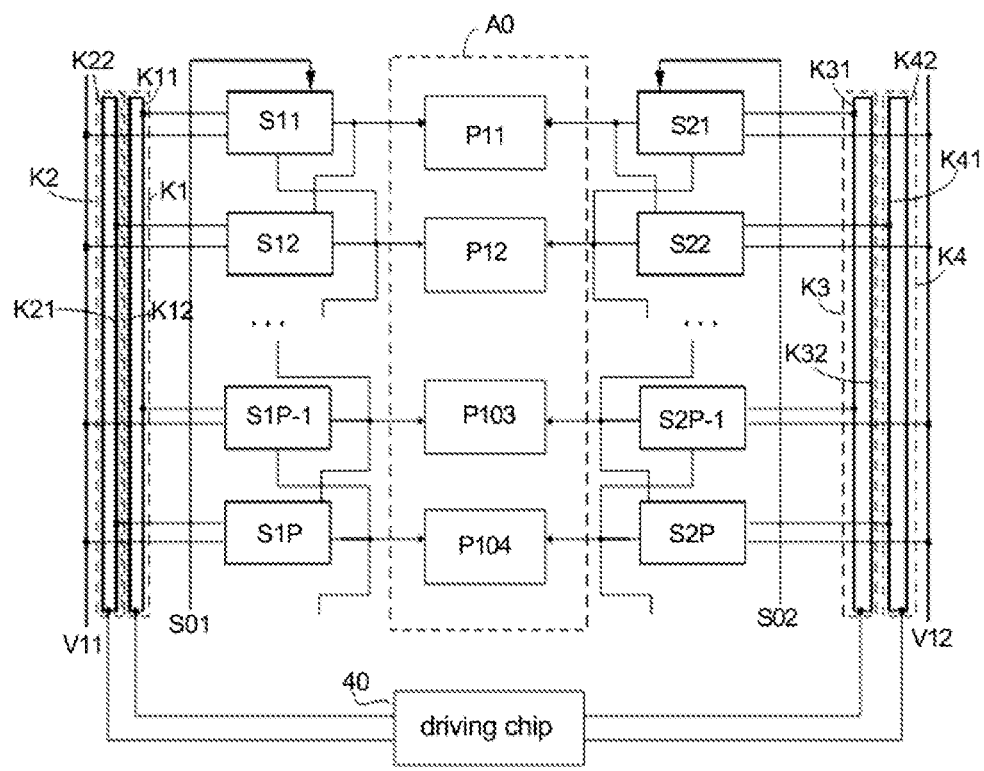
FIG. 17 is another schematic view showing the display panel according to one embodiment of the present disclosure.

As shown in FIG. 17, the display panel includes a first driving circuit, a second driving circuit, a first clock signal line K1, a second clock signal line K2, a third clock signal line K3 and a fourth clock signal line K4. The first clock signal line K1 and the second clock signal line K2 are arranged at a left side of the display panel, and the third clock signal line K3 and the fourth clock signal line K4 are arranged at a right side of the display panel. The first driving circuit is arranged at the left side of the display panel, and the second driving circuit is arranged at the right side of the display panel.

In FIG. 17, S11 represents a first-level left shift register unit of the first driving circuit, S12 represents a second-level left shift register unit of the first driving circuit, S1P−1 represents a $(P-1)^{th}$-level left shift register unit of the first driving circuit, and SP represents a $P^{th}$-level left shift register unit of the first driving circuit, where P is an integer greater than 3.

S21 represents a first-level right shift register unit of the second driving circuit, S22 represents a second-level right shift register unit of the second driving circuit, S2P−1 represents a $(P-1)^{th}$-level right shift register unit of the second driving circuit, and S2P represents a $P^{th}$-level right shift register unit of the second driving circuit.

In FIG. 17, P11 represents pixel circuits in a first row at the display region A0, P11 represents pixel circuits in a second row at the display region A0, P103 represents pixel circuits in a $(P-1)^{th}$ row at the display region A0, and P104 represents pixel circuits in a $P^{th}$ row at the display region A0.

S11 and S21 each provide a gate driving signal to P11, S12 and S22 each provide a gate driving signal to P12, S1P-1 and S2P-1 each provide a gate driving signal to P103, and SIP and S2P each provide a gate driving signal to P104.

The first clock signal line K1 and the second clock signal line K2 are arranged at a side of the first driving circuit away from A0, and the third clock signal line K3 and the fourth clock signal line K4 are arranged at a side of the second driving circuit away from A0.

The first clock signal line K1 includes a first main signal sub-line K11 and a second main signal sub-line K12, the second clock signal line K2 includes a third main signal sub-line K21 and a fourth main signal sub-line K22, the third clock signal line K3 includes a fifth main signal sub-line K31 and a sixth main signal sub-line K32, and the fourth clock signal line K4 includes a seventh main signal sub-line K41 and an eighth main signal sub-line K42. A first end of K11 is a lower end of K11, a second end of K11 is an upper end of K11, a first end of K12 is a lower end of K12, a second end of K12 is an upper end of K12, a first end of K21 is a lower end of K21, a second end of K21 is an upper end of K21, a first end of K22 is a lower end of K22, and a second end of K22 is an upper end of K22. The first end of K11 is electrically coupled to the first end of K12 through a conductive line, and the second end of K11 is electrically coupled to the second end of K12 through a conductive line. The first end of K21 is electrically coupled to the first end of K22 through a conductive line, and the second end of K21 is electrically coupled to the second end of K22 through a conductive line. A first end of K31 is a lower end of K31, a second end of K31 is an upper end of K31, a first end of K32 is a lower end of K32, a second end of K32 is an upper end of K32, a first end of K41 is a lower end of K41, a second end of K41 is an upper end of K41, a first end of K42 is a lower end of K42, and a second end of K42 is an upper end of K42. The first end of K31 is electrically coupled to the first end of K32 through a conductive line, and the second end of K31 is electrically coupled to the second end of K32 through a conductive line. The first end of K41 is electrically coupled to the first end of K42 through a conductive line, and the second end of K41 is electrically coupled to the second end of K42 through a conductive line.

In the embodiments of the present disclosure as shown in FIG. 17, each driving circuit is, but not limited to, a gate driving circuit, and the signal provided by each driving circuit is, but not limited to, a gate driving signal.

In the embodiments of the present disclosure as shown in FIG. 17, V11 represents a first low voltage line, V12 represents a second low voltage line, S01 represents a first start signal line, and S02 is a second start signal line.

As shown in FIG. 17, K11 is directly electrically coupled to S11 and S1P-1, and configured to provide a first clock signal to S11 and S1P-1. K21 is directly electrically coupled to S12 and S1P, and configured to provide a second clock signal to S12 and SIP. K31 is directly electrically coupled to S21 and S2P-1, and configured to provide a third clock signal to S21 and S2P-1. K41 is directly electrically coupled to S22 and S2P, and configured to provide a fourth clock signal to S22 and S2P.

The first clock signal is identical to the third clock signal, and the second clock signal is identical to the fourth clock signal.

V11 is electrically coupled to S11, S12, S1P-1 and S1P, and configured to provide a first low voltage signal to S11, S12, S1P-1 and S1P. V12 is electrically coupled to S21, S22, S2P-1 and S2P, and configured to provide a first low voltage signal to S21, S22, S2P-1 and S2P.

S01 is electrically coupled to S11, and configured to provide a first start signal to S11. S02 is electrically coupled to S21, and configured to provide a second start signal to S21.

In addition, in the embodiments of the present disclosure as shown in FIG. 17, the first end is a proximal end, and the second end is a distal end. The proximal end is an end of each clock signal line closer to the driving chip, and the distal end is an end of each clock signal line away from the driving chip.

As shown in FIG. 17, the driving chip 40 is arranged at a lower side of the display panel, and configured to provide the first clock signal to K1, provide the second clock signal to K2, provide the third clock signal to K3, provide the fourth clock signal to K4, provide the first start signal to S01, provide the second start signal to S02, provide the first low voltage signal to V11, and provide the second low voltage signal to V12.

In the embodiments of the present disclosure as shown in FIG. 13, each clock signal line includes two main signal sub-lines. One main signal sub-line is not directly electrically coupled to the driving circuit, and no parasitic capacitance is generated for the main signal sub-line. In this way, it is able to prevent the clock signal outputted by the clock signal line at the distal end from being distorted, thereby to remarkably reduce the fall time Tf of the gate driving signal outputted by the shift register unit electrically coupled to a portion of the clock signal line adjacent to the distal end.

In a possible embodiment of the present disclosure, the signal line is arranged at a third side of the display panel, and the driving chip for providing the signal to the signal line is attached at the third side. The signal line is arranged between the driving chip and the display region.

In the embodiments of the present disclosure, the driving circuit and the signal line are arranged at a same side as the driving chip, the driving circuit provides the signal to the signal line, the signal line provides the signal to the driving circuit, and the driving circuit provides a control signal to a gate line at the display region. At this time, the signal line is arranged at a side of the driving circuit away from the display region, or between the driving circuit and the display region.

In actual use, in order to provide a narrow bezel, i.e., to reduce a width of each of the first side and the second side of the display panel, the signal line and the driving circuit are arranged at the third side of the display region.

In a possible embodiment of the present disclosure, the driving chip for providing the signal to the signal line is attached at a third side of the display panel, the signal line and the driving circuit are arranged at a fourth side of the display panel, and the third side is opposite to the fourth side.

In the embodiments of the present disclosure, the driving circuit and the signal line are arranged at the fourth side of the display panel, and the fourth side is opposite to the third side, so as to provide the narrow bezel. At this time, the signal line is arranged at a side of the driving circuit away from the display region, or between the driving circuit and the display region.

During the implementation, the display panel further includes a plurality of gate lines arranged on the base substrate and at the display region, and the extension direction of the main signal sub-line is identical to, or approximately identical to, an extension direction of each gate line.

In the embodiments of the present disclosure, when the extension direction of each main signal sub-line is approximately identical to the extension direction of each gate line, it means that an angle between the extension direction of each main signal sub-line and the extension direction of each gate line is smaller than a predetermined angle.

Figure 18:
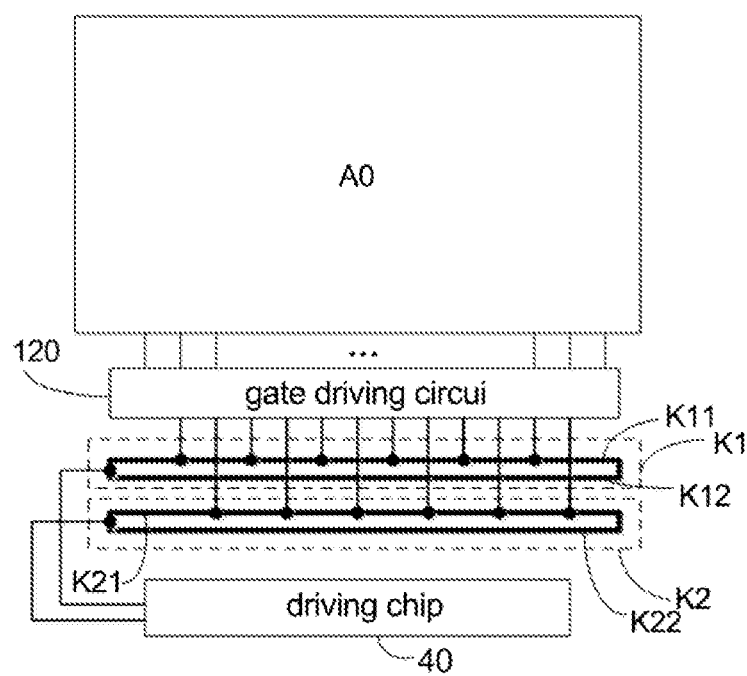
FIG. 18 is yet another schematic view showing the display panel according to one embodiment of the present disclosure.

As shown in FIG. 18, the display panel in the embodiments of the present disclosure includes a driving circuit 120, a first clock signal line K1 and a second clock signal line K2. The driving chip 40, the driving circuit 120, K1 and K2 are arranged at a lower side of the display panel. The driving circuit 120 is configured to provide a gate driving signal to each gate line at the display region A0. The first clock signal line K1 includes a first main signal sub-line K11 and a second main signal sub-line K12, and the second clock signal line K2 includes a third main signal sub-line K21 and a fourth main signal sub-line K22. A first end of K11 is a left end of K11, a second end of K11 is a right end of K11, a first end of K12 is a left end of K12, a second end of K12 is a right end of K12, a first end of K21 is a left end of K21, a second end of K21 is a right end of K21, a first end of K22 is a left end of K22, and a second end of K22 is a right end of K22. The first end of K11 is electrically coupled to the first end of K12 through a conductive line, and the second end of K11 is electrically coupled to the second end of K12 through a conductive line. When K11 is coupled in parallel to K12, it is able to reduce a resistance of K1. The first end of K21 is electrically coupled to the first end of K22 through a conductive line, and the second end of K21 is electrically coupled to the second end of K22 through a conductive line. When K21 is coupled in parallel to K22, it is able to reduce a resistance of K2.

As shown in FIG. 18, K11 and K21 are directly electrically coupled to the driving circuit 120, and K12 and K22 are not directly coupled to the driving circuit 120, so the parasitic capacitance on each of K12 and K22 is very small.

In the embodiments of the present disclosure as shown in FIG. 18, each clock signal line includes two main signal sub-lines. One main signal sub-line is not directly electrically coupled to the driving circuit, and no parasitic capacitance is generated for the main signal sub-line. In this way, it is able to prevent the clock signal outputted by the clock signal line at the distal end from being distorted, thereby to remarkably reduce the fall time Tf of the gate driving signal outputted by the shift register unit electrically coupled to a portion of the clock signal line adjacent to the distal end.

In the embodiments of the present disclosure as shown in FIG. 18, the driving circuit is, but not limited to, a gate driving circuit, and the signal provided by the driving circuit is, but not limited to, a gate driving signal.

In the embodiments of the present disclosure as shown in FIG. 18, when the third side is a lower side and the driving circuit 120 and the driving chip 40 are arranged at the lower side of the display panel, the driving circuit is electrically coupled to each gate line at the display region through a vertical line. However, the present disclosure is not limited thereto.

Figure 19:
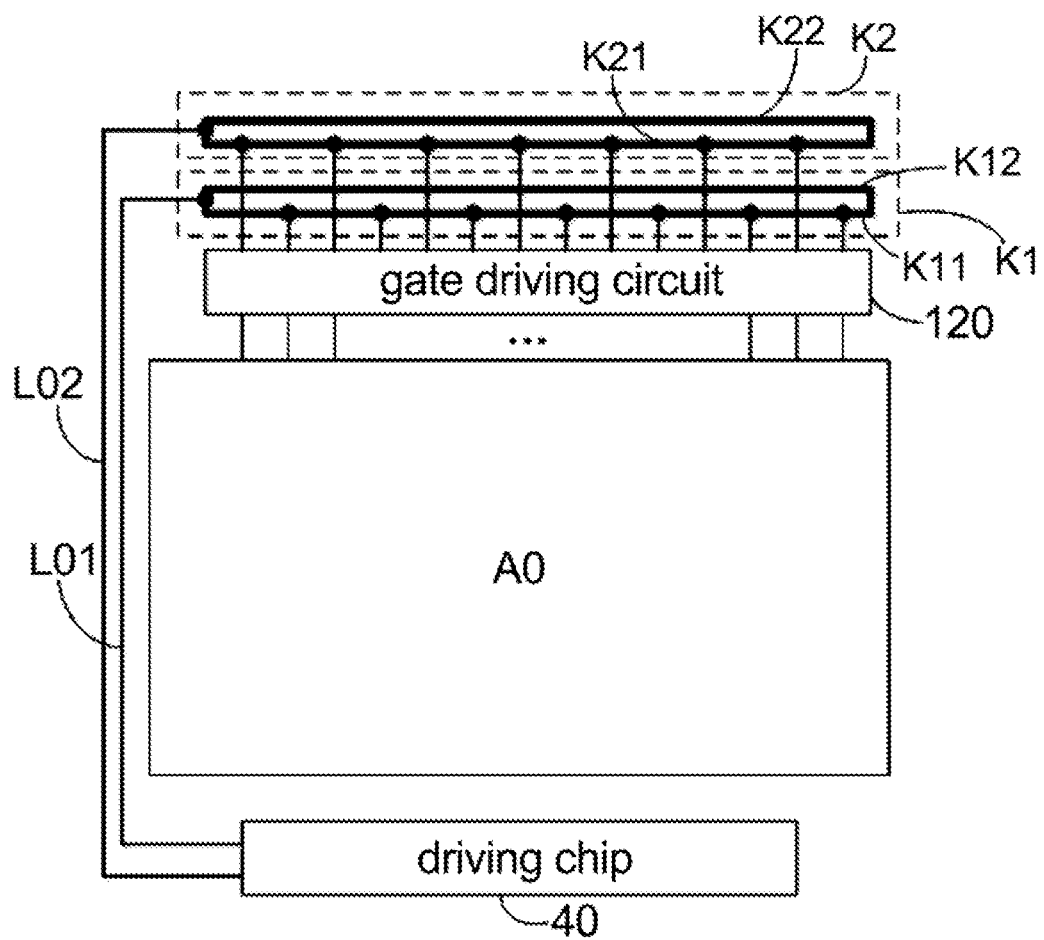
FIG. 19 is still yet another schematic view showing the display panel according to one embodiment of the present disclosure.

As shown in FIG. 19, the display panel in the embodiments of the present disclosure includes a driving circuit 120, a first clock signal line K1 and a second clock signal line K2. The driving chip 40 is arranged at a lower side of the display panel, and the driving circuit 120, K1 and K2 are arranged at an upper side of the display panel. The driving circuit 120 is configured to provide a gate driving signal to each gate line at the display region A0. The first clock signal line K1 includes a first main signal sub-line K11 and a second main signal sub-line K12, and the second clock signal line K2 includes a third main signal sub-line K21 and a fourth main signal sub-line K22. A first end of K11 is a left end of K11, a second end of K11 is a right end of K11, a first end of K12 is a left end of K12, a second end of K12 is a right end of K12, a first end of K21 is a left end of K21, a second end of K21 is a right end of K21, a first end of K22 is a left end of K22, and a second end of K22 is a right end of K22. The first end of K11 is electrically coupled to the first end of K12 through a conductive line, and the second end of K11 is electrically coupled to the second end of K12 through a conductive line. When K11 is coupled in parallel to K12, it is able to reduce a resistance of K1. The first end of K21 is electrically coupled to the first end of K22 through a conductive line, and the second end of K21 is electrically coupled to the second end of K22 through a conductive line. When K21 is coupled in parallel to K22, it is able to reduce a resistance of K2.

As shown in FIG. 19, K11 and K21 are directly electrically coupled to the driving circuit 40, and K12 and K22 are not directly coupled to the driving circuit 120, so the parasitic capacitance on each of K12 and K22 is very small.

In the embodiments of the present disclosure as shown in FIG. 19, the driving chip 40 is electrically coupled to the left end of K11 and the left end of K12 through a first signal output line L01, so as to provide a first clock signal to K1. The driving chip 40 is electrically coupled to the left end of K21 and the left end of K22 through a second signal output line L02, so as to provide a second clock signal to K2.

In the embodiments of the present disclosure as shown in FIG. 19, each clock signal line includes two main signal sub-lines. One main signal sub-line is not directly electrically coupled to the driving circuit, and no parasitic capacitance is generated for the main signal sub-line. In this way, it is able to prevent the clock signal outputted by the clock signal line at the distal end from being distorted, thereby to remarkably reduce the fall time Tf of the gate driving signal outputted by the shift register unit electrically coupled to a portion of the clock signal line adjacent to the distal end.

In the embodiments of the present disclosure as shown in FIG. 19, the driving circuit is, but not limited to, a gate driving circuit, and the signal provided by the driving circuit is, but not limited to, a gate driving signal.

In the embodiments of the present disclosure as shown in FIG. 19, when the fourth side is an upper side and the driving circuit 120 and the driving chip 40 are arranged at the upper side of the display panel, the driving circuit is electrically coupled to each gate line at the display region through a vertical line. However, the present disclosure is not limited thereto.

The present disclosure further provides in some embodiments a display device including the above-mentioned display panel.

In a possible embodiment of the present disclosure, the display device further includes a driving chip configured to provide the signal through a signal output end. The signal output end of the driving chip is electrically coupled to the first ends of the at least two main signal sub-lines.

The display device in the embodiments of the present disclosure is any product or member having a display function, e.g., mobile phone, tablet computer, television, display, laptop computer, digital photo frame or navigator.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a driving circuit arranged on a base substrate and a signal line configured to provide a signal to the driving circuit,
wherein the signal line comprises at least two main signal sub-lines, each main signal sub-line comprises a first end and a second end,
the first ends of the at least two main signal sub-lines are electrically coupled to each other, and the second ends of the at least two main signal sub-lines are electrically coupled to each other;
N main signal sub-lines in the at least two main signal sub-lines are directly electrically coupled to the driving circuit, and configured to provide the signal to the driving circuit; and each of the N main signal sub-lines is a direct-coupled main signal sub-line, and a main signal sub-line in the at least two main signal sub-lines other than the direct-coupled main signal sub-lines is an indirect-coupled main signal sub-line, and the indirect-coupled main signal sub-line is not directly electrically coupled to the driving circuit but electrically coupled to the driving circuit via the direct-coupled main signal sub-line,
wherein N is a positive integer and smaller than the quantity of the main signal sub-lines in the signal line;
wherein the quantity of main signal sub-lines in the signal line is A, the signal line further comprises M auxiliary signal sub-lines, and an $a^{th}$ main signal sub-line corresponds to an $m^{th}$ auxiliary signal sub-line, wherein A is an integer greater than 1, M is a positive integer, a is a positive integer smaller than or equal to A, and m is a positive integer smaller than or equal to M,
wherein the $a^{th}$ main signal sub-line is electrically coupled to the $m^{th}$ auxiliary signal sub-line through at least two connection via-holes, the $a^{th}$ main signal sub-line and the $m^{th}$ auxiliary signal sub-line are arranged at different conductive layers, and an orthogonal projection of the $a^{th}$ main signal sub-line onto the base substrate at least partially overlaps an orthogonal projection of the $m^{th}$ auxiliary signal sub-line onto the base substrate;
wherein each auxiliary signal sub-line comprises a plurality of auxiliary line portions electrically coupled to a corresponding main signal sub-line through at least two via-holes, and an orthogonal projection of each auxiliary line portion onto the base substrate is located within an orthogonal projection of the corresponding main signal sub-line onto the base substrate.

2. The display panel according to claim 1, wherein the at least two main signal sub-lines are formed at a same conductive layer, or at different conductive layers.

3. The display panel according to claim 2, wherein the signal line comprises a first clock signal line and a second clock signal, the display panel comprises a driving circuit, and the driving circuit, the first clock signal line and the second clock signal line are arranged at a same side of the display panel;
the first clock signal line comprises a first main signal sub-line and a second main signal sub-line, and the second clock signal line comprises a third main signal sub-line and a fourth main signal sub-line; and
the driving circuit comprises a plurality of levels of shift register units,
the first main signal sub-line is directly electrically coupled to odd-numbered-level shift register units, and the third main signal sub-line is directly electrically coupled to even-numbered-level shift register units.

4. The display panel according to claim 2, wherein the signal line comprises a first clock signal line, a second clock signal line, a third clock signal line and a fourth clock signal line, the display panel comprises a first driving circuit and a second driving circuit, the first driving circuit, the first clock signal line and the second clock signal line are arranged at one side of the display panel, and the second driving circuit, the third clock signal line and the fourth clock signal line are arranged at the other side of the display panel;
the first clock signal line comprises a first main signal sub-line and a second main signal sub-line, the second clock signal line comprises a third main signal sub-line and a fourth main signal sub-line, the third clock signal line comprises a fifth main signal sub-line and a sixth main signal sub-line, and the fourth clock signal line comprises a seventh main signal sub-line and an eighth main signal sub-line;
the first driving circuit comprises a plurality of levels of shift register units, and the second driving circuit comprises a plurality of levels of shift register units; and
the first main signal sub-line is directly electrically coupled to odd-numbered-level shift register units in the first driving circuit, the third main signal sub-line is directly electrically coupled to even-numbered-level shift register units in the first driving circuit, the fifth main signal sub-line is directly electrically coupled to odd-numbered-level shift register units in the second driving circuit, and the seventh main signal sub-line is directly electrically coupled to even-numbered-level shift register units in the second driving circuit.

5. The display panel according to claim 1, further comprising connection lines, wherein each connection line is electrically coupled to the driving circuit,
the connection lines and the direct-coupled main signal sub-lines are arranged at different conductive layers, the connection line is electrically coupled to the direct-coupled main signal sub-line through a via-hole, and the connection lines at a same layer do not overlap each other.

6. The display panel according to claim 5, wherein the signal line comprises a first clock signal line and a second clock signal, the display panel comprises a driving circuit, and the driving circuit, the first clock signal line and the second clock signal line are arranged at a same side of the display panel;
the first clock signal line comprises a first main signal sub-line and a second main signal sub-line, and the second clock signal line comprises a third main signal sub-line and a fourth main signal sub-line; and
the driving circuit comprises a plurality of levels of shift register units,
the first main signal sub-line is directly electrically coupled to odd-numbered-level shift register units, and the third main signal sub-line is directly electrically coupled to even-numbered-level shift register units.

7. The display panel according to claim 5, wherein the signal line comprises a first clock signal line, a second clock signal line, a third clock signal line and a fourth clock signal line, the display panel comprises a first driving circuit and a second driving circuit, the first driving circuit, the first clock signal line and the second clock signal line are arranged at one side of the display panel, and the second driving circuit, the third clock signal line and the fourth clock signal line are arranged at the other side of the display panel;
the first clock signal line comprises a first main signal sub-line and a second main signal sub-line, the second clock signal line comprises a third main signal sub-line and a fourth main signal sub-line, the third clock signal line comprises a fifth main signal sub-line and a sixth main signal sub-line, and the fourth clock signal line comprises a seventh main signal sub-line and an eighth main signal sub-line;
the first driving circuit comprises a plurality of levels of shift register units, and the second driving circuit comprises a plurality of levels of shift register units; and
the first main signal sub-line is directly electrically coupled to odd-numbered-level shift register units in the first driving circuit, the third main signal sub-line is directly electrically coupled to even-numbered-level shift register units in the first driving circuit, the fifth main signal sub-line is directly electrically coupled to odd-numbered-level shift register units in the second driving circuit, and the seventh main signal sub-line is directly electrically coupled to even-numbered-level shift register units in the second driving circuit.

8. The display panel according to claim 1, wherein a maximum distance between an orthogonal projection of one connection via-hole in the at least two connection via-holes onto the base substrate and an orthogonal projection of a first end of the $a^{th}$ main signal sub-line onto the base substrate is smaller than a first predetermined distance, and
a maximum distance between an orthogonal projection of another connection via-hole in the at least two connection via-holes onto the base substrate and an orthogonal projection of a second end of the $a^{th}$ main signal sub-line onto the base substrate is smaller than the first predetermined distance.

9. The display panel according to claim 8, wherein the signal line comprises a first clock signal line and a second clock signal, the display panel comprises a driving circuit, and the driving circuit, the first clock signal line and the second clock signal line are arranged at a same side of the display panel;
the first clock signal line comprises a first main signal sub-line and a second main signal sub-line, and the second clock signal line comprises a third main signal sub-line and a fourth main signal sub-line; and
the driving circuit comprises a plurality of levels of shift register units,
the first main signal sub-line is directly electrically coupled to odd-numbered-level shift register units, and the third main signal sub-line is directly electrically coupled to even-numbered-level shift register units.

10. The display panel according to claim 9, wherein the signal line comprises a first clock signal line, a second clock signal line, a third clock signal line and a fourth clock signal line, the display panel comprises a first driving circuit and a second driving circuit, the first driving circuit, the first clock signal line and the second clock signal line are arranged at one side of the display panel, and the second driving circuit, the third clock signal line and the fourth clock signal line are arranged at the other side of the display panel;
the first clock signal line comprises a first main signal sub-line and a second main signal sub-line, the second clock signal line comprises a third main signal sub-line and a fourth main signal sub-line, the third clock signal line comprises a fifth main signal sub-line and a sixth main signal sub-line, and the fourth clock signal line comprises a seventh main signal sub-line and an eighth main signal sub-line;
the first driving circuit comprises a plurality of levels of shift register units, and the second driving circuit comprises a plurality of levels of shift register units; and
the first main signal sub-line is directly electrically coupled to odd-numbered-level shift register units in the first driving circuit, the third main signal sub-line is directly electrically coupled to even-numbered-level shift register units in the first driving circuit, the fifth main signal sub-line is directly electrically coupled to odd-numbered-level shift register units in the second driving circuit, and the seventh main signal sub-line is directly electrically coupled to even-numbered-level shift register units in the second driving circuit.

11. The display panel according to claim 1, wherein the auxiliary line portion comprises a third end and a fourth end,
a maximum distance between an orthogonal projection of one via-hole in the at least two via-holes onto the base substrate and an orthogonal projection of the third end of the auxiliary line portion onto the base substrate is smaller than a second predetermined distance, and
a maximum distance between an orthogonal projection of another via-hole in the at least two via-holes onto the base substrate and an orthogonal projection of the fourth end of the auxiliary line portion onto the base substrate is smaller than the second predetermined distance.

12. The display panel according to claim 1, wherein a gap is provided between two adjacent auxiliary line portions of a same auxiliary signal sub-line;
the display panel further comprises connection lines each electrically coupled to the direct-coupled main signal sub-line through a via-hole, and different connection lines at a same layer do not overlap each other; and
the connection lines and the auxiliary signal sub-lines are arranged at a same conductive layer, the connection lines are electrically coupled to the driving circuit through a part of the gap, and the connection lines and the auxiliary signal sub-lines do not overlap to each other.

13. The display panel according to claim 1, wherein the signal line comprises a first clock signal line and a second clock signal, the display panel comprises a driving circuit, and the driving circuit, the first clock signal line and the second clock signal line are arranged at a same side of the display panel;

the first clock signal line comprises a first main signal sub-line and a second main signal sub-line, and the second clock signal line comprises a third main signal sub-line and a fourth main signal sub-line; and the driving circuit comprises a plurality of levels of shift register units, the first main signal sub-line is directly electrically coupled to odd-numbered-level shift register units, and the third main signal sub-line is directly electrically coupled to even-numbered-level shift register units.

14. The display panel according to claim 1, wherein the signal line comprises a first clock signal line, a second clock signal line, a third clock signal line and a fourth clock signal line, the display panel comprises a first driving circuit and a second driving circuit, the first driving circuit, the first clock signal line and the second clock signal line are arranged at one side of the display panel, and the second driving circuit, the third clock signal line and the fourth clock signal line are arranged at the other side of the display panel;

the first clock signal line comprises a first main signal sub-line and a second main signal sub-line, the second clock signal line comprises a third main signal sub-line and a fourth main signal sub-line, the third clock signal line comprises a fifth main signal sub-line and a sixth main signal sub-line, and the fourth clock signal line comprises a seventh main signal sub-line and an eighth main signal sub-line;

the first driving circuit comprises a plurality of levels of shift register units, and the second driving circuit comprises a plurality of levels of shift register units; and the first main signal sub-line is directly electrically coupled to odd-numbered-level shift register units in the first driving circuit, the third main signal sub-line is directly electrically coupled to even-numbered-level shift register units in the first driving circuit, the fifth main signal sub-line is directly electrically coupled to odd-numbered-level shift register units in the second driving circuit, and the seventh main signal sub-line is directly electrically coupled to even-numbered-level shift register units in the second driving circuit.

15. A display device, comprising the display panel according to claim 1.

16. The display device according to claim 15, further comprising a driving chip configured to provide the signal via a signal output end, wherein the signal output end of the driving chip is electrically coupled to the first ends of the at least two main signal sub-lines.

* * * * *